(12) United States Patent
Makihara et al.

(10) Patent No.: US 7,746,254 B2
(45) Date of Patent: Jun. 29, 2010

(54) SAMPLE AND HOLD CIRCUIT, MULTIPLYING D/A CONVERTER HAVING THE SAME, AND A/D CONVERTER HAVING THE SAME

(75) Inventors: Tetsuya Makihara, Nukata-gun (JP); Masakiyo Horie, Gamagori (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/318,201

(22) Filed: Dec. 23, 2008

(65) Prior Publication Data
US 2009/0167582 A1 Jul. 2, 2009

(30) Foreign Application Priority Data

Dec. 26, 2007 (JP) ............................. 2007-334308
Aug. 26, 2008 (JP) ............................. 2008-216585

(51) Int. Cl.
*H03M 1/00* (2006.01)
(52) U.S. Cl. ..................... 341/122; 341/172; 341/155
(58) Field of Classification Search ................ 341/144, 341/155, 172, 122
See application file for complete search history.

(56) References Cited

U.S. PATENT DOCUMENTS

| 4,899,068 | A | | 2/1990 | Klose et al. |
|---|---|---|---|---|
| 5,453,757 | A | * | 9/1995 | Date et al. ................. 345/89 |
| 6,084,465 | A | * | 7/2000 | Dasgupta ................ 327/554 |
| 6,169,427 | B1 | * | 1/2001 | Brandt ..................... 327/94 |
| 7,312,733 | B2 | | 12/2007 | Takahashi et al. |
| 7,397,287 | B2 | | 7/2008 | Makihara |
| 7,626,524 | B2 | * | 12/2009 | Horie ..................... 341/141 |
| 7,649,488 | B1 | * | 1/2010 | Johansson ............... 341/163 |
| 2008/0218266 | A1 | * | 9/2008 | Kobayashi et al. ......... 330/258 |

FOREIGN PATENT DOCUMENTS

| JP | A-1-092999 | 4/1989 |
|---|---|---|
| JP | A-2002-305448 | 10/2002 |
| JP | A-2006-024975 | 1/2006 |

\* cited by examiner

*Primary Examiner*—Peguy JeanPierre
(74) *Attorney, Agent, or Firm*—Posz Law Group, PLC

(57) ABSTRACT

A sample and hold circuit includes an op-amp, inverting-side capacitors, and non-inverting-side capacitors paired with the inverting-side capacitors. At least one capacitor pair serves as a feedback capacitor in a holding phase. A total capacitance of the inverting-side capacitors to which an input voltage is applied in a sampling phase is $\alpha$, a total capacitance of the non-inverting-side capacitors to which the input voltage is applied in the sampling phase is $\beta$, a total capacitance of the inverting-side capacitors to which the input voltage is applied in a holding phase is $\gamma$, and a total capacitance of the non-inverting-side capacitors to which the input voltage is applied in the holding phase is $\eta$. $\alpha$ is substantially different from $\beta$. A total capacitance of a feedback capacitor pair is substantially equal to $(\alpha-\beta-\gamma+\eta) \cdot (N/2)$, where N is a positive number.

16 Claims, 15 Drawing Sheets

FIG. 4

| | SAMPLING | | | | | | HOLDING | | | |
|---|---|---|---|---|---|---|---|---|---|---|
| | INVERTING | | | NON-INVERTING | | | INVERTING | | NON-INVERTING | |
| | x | y | z | x | y | z | x | y | x | y |
| CASE | Va | Vb | Vc | Vd | Ve | Vf | Vg | Vh | Vi | Vj |
| 1 | | | ● | | | | ● | | ● | |
| 2 | | | ● | | | | ● | ● | ● | ● |
| 3 | ● | | | | | | ● | | | ● |
| 4 | ● | ● | | | | | ● | | | ● |
| 5 | ● | | | ● | | | ● | | ● | |
| 6 | ● | | ● | | | | ● | | | ● |
| 7 | | | ● | ● | | | ● | | | ● |
| 8 | ● | | ● | ● | | | ● | | | ● |
| 9 | ● | | ● | ● | | | ● | ● | ● | ● |

FIG. 5

| CASE | $\alpha$ | $\beta$ | $\gamma$ | $\eta$ | $\alpha+\beta$ | $\gamma+\eta$ |
|---|---|---|---|---|---|---|
| 1 | z | 0 | x | x | z | 2x |
| 2 | z | 0 | x+y | x+y | z | 2(x+y) |
| 3 | x | 0 | y | y | x | 2y |
| 4 | x+y | 0 | x | y | x+y | x+y |
| 5 | x | x | x | x | 2x | 2x |
| 6 | x+z | 0 | y | y | x+z | 2y |
| 7 | z | x | y | y | x+z | 2y |
| 8 | x+z | x | y | y | 2x+z | 2y |
| 9 | x+z | x | x+y | x+y | 2x+z | 2(x+y) |

FIG. 6

| CASE | CON1 $\alpha+\beta=\gamma+\eta$ | CON2 $\gamma=\eta$ | CON3 $\alpha\neq\beta$ | CON4 $\alpha-\beta-\gamma+\eta$ | $(\alpha-\beta-\gamma+\eta)/z$ | $x:y:z$ |
|---|---|---|---|---|---|---|
| 1 | IF z=2x, OK | OK | OK | z | 1 | |
| 2 | IF z=2(x+y), OK | OK | OK | z | 1 | |
| 3 | IF x=2y, OK | OK | OK | x | x/z | 2:1:N |
| 4 | OK | IF x=y, OK | OK | x+y | (x+y)/z | 1:1:N |
| 5 | OK | OK | NG | 0 | 0 | |
| 6 | IF x+z=2y, OK | OK | OK | x+z | 1+x/z | 2−N:1:N |
| 7 | IF x+z=2y, OK | OK | OK | z−x | 1−x/z | N−2:N−1:N |
| 8 | IF 2x+z=2y, OK | OK | OK | z | 1 | |
| 9 | IF z=2y, OK | OK | OK | z | 1 | |

FIG. 7

| CASE | SAMPLING | | | | | | HOLDING | | | |
|---|---|---|---|---|---|---|---|---|---|---|
| | INVERTING | | | NON-INVERTING | | | INVERTING | | NON-INVERTING | |
| | x | y | z | x | y | z | x | y | x | y |
| | Va | Vb | Vc | Vd | Ve | Vf | Vg | Vh | Vi | Vj |
| 10 |  |  | ● |  |  |  |  |  | ● | ● |
| 11 |  |  | ● |  |  |  |  |  | ● |  |
| 12 | ● |  |  |  |  |  |  |  | ● |  |
| 13 | ● | ● |  |  |  |  |  |  | ● | ● |
| 14 | ● | ● |  |  |  |  |  | ● | ● |  |
| 15 | ● |  |  | ● |  |  |  |  |  | ● |
| 16 | ● |  | ● |  |  |  |  |  |  | ● |
| 17 |  |  | ● | ● |  |  |  |  |  | ● |

FIG. 8

| CASE | $\alpha$ | $\beta$ | $\gamma$ | $\eta$ | $\alpha + \eta$ | $\beta + \gamma$ |
|---|---|---|---|---|---|---|
| 10 | z | 0 | 0 | x+y | x+y+z | 0 |
| 11 | z | 0 | 0 | x | x+z | 0 |
| 12 | x | 0 | 0 | x | 2x | 0 |
| 13 | x+y | 0 | 0 | x+y | 2(x+y) | 0 |
| 14 | x+y | 0 | 0 | y | x | 2x+y | y |
| 15 | x | x | 0 | y | x+y | x |
| 16 | x+z | 0 | 0 | y | x+y+z | 0 |
| 17 | z | x | 0 | y | y+z | x |

FIG. 9

| CASE | CON1 | CON5 | | CON4 | |
|---|---|---|---|---|---|
| | $\alpha+\beta=\gamma+\eta$ | $\alpha+\eta\neq\beta+\gamma$ | $\alpha-\beta-\gamma+\eta$ | $(\alpha-\beta-\gamma+\eta)/z$ | $x:y:z$ |
| 10 | IF $x+y=z$, OK | OK | $x+y+z=2z$ | 2 | |
| 11 | IF $x=z$, OK | OK | $x+z=2z$ | 2 | |
| 12 | OK | OK | $2x$ | $2x/z$ | $1:1:N$ |
| 13 | OK | OK | $2(x+y)$ | $2(x+y)/z$ | $1:1:2N$ |
| 14 | OK | OK | $2x$ | $2x/z$ | $1:1:N$ |
| 15 | IF $2x=y$, OK | OK | $y$ | $y/z$ | $1:2:N$ |
| 16 | IF $x+z=y$, OK | OK | $x+y+z=2y$ | $2y/z$ | $1-N:1:N$ |
| 17 | IF $x+z=y$, OK | OK | $z-x+y=2z$ | 2 | |

| | SAMPLING | | | | | | HOLDING | | | |
|---|---|---|---|---|---|---|---|---|---|---|
| | INVERTING | | | NON-INVERTING | | | INVERTING | | NON-INVERTING | |
| | x | y | z | x | y | z | x | y | x | y |
| CASE | Va | Vb | Vc | Vd | Ve | Vf | Vg | Vh | Vi | Vj |
| 18 | | | ●p | | | ○m | ○m | | ●p | |
| 19 | | | ●p | | | ○m | ○m | ●p | ○m | ●p |
| 20 | ●p | | | ○m | | | | ○m | | ●p |

FIG. 12A

| CASE | Vinp | | | | | |
|---|---|---|---|---|---|---|
| | $\alpha p$ | $\beta p$ | $\gamma p$ | $\eta p$ | $\alpha p + \beta p$ | $\gamma p + \eta p$ |
| 18 | z | 0 | 0 | x | z | x |
| 19 | z | 0 | y | y | z | 2x |
| 20 | z | 0 | 0 | y | x | z |

FIG. 12B

| CASE | Vinp | | | | | |
|---|---|---|---|---|---|---|
| | CON1 $\alpha p + \beta p = \gamma p + \eta p$ | CON2 $\gamma p = \eta p$ | CON3 $\alpha p \neq \beta p$ | CON5 $\alpha p + \eta p \neq \beta p + \gamma p$ | CON6 $\alpha p = \beta m - \alpha m$ |
| 18 | IF x=z, OK | NG | OK | OK | $\alpha p - \beta p = \beta m - \alpha m$ OK |
| 19 | IF 2y=z, OK | OK | OK | OK | OK |
| 20 | IF x=y, OK | NG | OK | OK | OK |

FIG. 13A

| CASE | $\alpha m$ | $\beta m$ | $\gamma m$ | $\eta m$ | $\alpha m + \beta m$ | $\gamma m + \eta m$ |
|------|-----------|-----------|-----------|-----------|---------------------|---------------------|
| 18 | 0 | z | x | 0 | z | x |
| 19 | 0 | z | x | x | z | 2x |
| 20 | 0 | x | y | 0 | x | y |

Vinm

FIG. 13B

| CASE | CON1 $\alpha m + \beta m = \gamma m + \eta m$ | CON2 $\gamma m = \eta m$ | CON3 $\alpha m \neq \beta m$ | CON5 $\alpha m + \eta m \neq \beta m + \gamma m$ |
|------|-----------------------------------------------|--------------------------|------------------------------|---------------------------------------------------|
| 18 | IF x=z, OK | NG | OK | OK |
| 19 | IF 2x=z, OK | OK | OK | OK |
| 20 | IF x=y, OK | NG | OK | OK |

Vinm

FIG. 14A

| CASE | Vinp $\alpha p-\beta p-\gamma p+\eta p$ | CON7 $(\alpha p-\beta p-\gamma p+\eta p)/z$ | TERM OF Vinp−Vinm | x:y:z |
|---|---|---|---|---|
| 18 | 2z | 2 | 2 | |
| 19 | z | 2 | 1 | |
| 20 | 2x | 2x/z | 2x/z | 1:1:N |

FIG. 14B

| CASE | Vinm $\alpha m-\beta m-\gamma m+\eta m$ | CON7 $(\alpha m-\beta m-\gamma m+\eta m)/z$ |
|---|---|---|
| 18 | −2z | −2 |
| 19 | −z | −1 |
| 20 | −2x | −2x/z |

SAMPLE AND HOLD CIRCUIT, MULTIPLYING D/A CONVERTER HAVING THE SAME, AND A/D CONVERTER HAVING THE SAME

CROSS REFERENCE TO RELATED APPLICATION

This application is based on and incorporates herein by reference Japanese Patent Applications No. 2007-334308 filed on Dec. 26, 2007 and No. 2008-216585 filed on Aug. 26, 2008.

FIELD OF THE INVENTION

The present invention relates to a sample and hold circuit, a multiplying D/A converter having the sample and hold circuit, and an A/D converter having the multiplying D/A converter.

BACKGROUND OF THE INVENTION

A multiplying digital-to-analog (D/A) converter is used in, for example, a cyclic A/D converter and each stage of a pipeline A/D converter. In a multiplying D/A converter disclosed in U.S. Pat. No. 7,397,287 corresponding to JP-A-2007-159087, an input voltage is subtracted by a reference voltage and then doubled. Then, a residue voltage is generated by subtracting a voltage depending on an A/D conversion value of the input voltage from the doubled voltage.

A single-ended input sample and hold circuit used in the multiplying D/A converter disclosed in U.S. Pat. No. 7,397,287 is constructed with an operational amplifier (op-amp), inverting-side capacitors connected to an inverting input terminal of the op-amp, and non-inverting-side capacitors paired with the inverting-side capacitors and connected to a non-inverting input terminal of the op-amp. In a sampling phase, at least one capacitor is charged by the input voltage, and each of the other capacitors is charged by a predetermined voltage. In a holding phase, the inverting-side and non-inverting-side capacitors of at least one capacitor pair are respectively connected between input and output terminals of the op-amp, and the input voltage is applied to at least one capacitor.

In the sample and hold circuit disclosed in U.S. Pat. No. 7,397,287, when predetermined conditions are met, an input voltage (i.e., common mode input voltage) of the op-amp in the holding phase does not depend on the input voltage of the op-amp in the sampling phase, and the sampled voltage accurately remains held even when the input voltage changes in the holding phase. In this way, the op-amp is supplied with a sufficient common mode input voltage that allows the op-amp to work at a desired gain and slew rate. In the sample and hold circuit and the multiplying D/A converter disclosed in U.S. Pat. No. 7,397,287, the input voltage range (input dynamic range) is limited to from 0 volts (V) to a power supply voltage. Therefore, for example, when the multiplying D/A converter is used in the initial stage of the pipeline A/D converter, a voltage outside the input voltage range cannot be inputted.

An A/D converter disclosed in JP-A-2006-024975 and U.S. Pat. No. 7,312,733 corresponding to JP-A-2006-115027 is configured to process a voltage outside an input voltage range. In the A/D converter disclosed in JP-A-2006-024975, an input voltage is divided by a voltage divider and then inputted to an A/D conversion section. In the A/D converter disclosed in U.S. Pat. No. 7,312,733, when it is detected that an A/D conversion value reaches the maximum or minimum value representable by A/D conversion bits, a bias voltage of an amplification circuit is switched by a bias control circuit to shift an output voltage of the amplifier circuit. An outputted digital value is corrected by correction data depending on the bias voltage.

As disclosed in JP-A-2006-024975 and U.S. Pat. No. 7,312,733, the input voltage range may be increased by using a voltage divider constructed with resistors or a bias control circuit. However, the addition of the voltage divider or the bias control circuit may result in a reduction in accuracy of A/D conversion, an increase in size, and an increase in the number of parts.

SUMMARY OF THE INVENTION

In view of the above, it is an object of the present invention to provide a sample and hold circuit having an increased input voltage range. It is another object of the present invention to provide a multiplying D/A converter having the sample and hold circuit and an A/D converter having the multiplying D/A converter.

According to a first aspect of the present invention, a sample and hold circuit for sampling and holding an input voltage includes an operational amplifier, inverting-side capacitors, non-inverting-side capacitors, and a control circuit. The operational amplifier is configured to convert the held voltage to a differential output voltage. The operational amplifier has inverting and non-inverting input terminals and inverting and non-inverting output terminals. Each inverting-side capacitor has a first end coupled to the inverting input terminal of the operational amplifier. Each non-inverting-side capacitor has a first end coupled to the non-inverting input terminal of the operational amplifier. The non-inverting-side capacitors are pared with the inverting-side capacitors to provide a plurality of capacitor pairs. Each capacitor pair includes one inverting-side capacitor and one non-inverting-side capacitor having the same capacitance. In a sampling phase of the input voltage, the control circuit applies the input voltage to at least one of the inverting-side and non-inverting-side capacitors and a predetermined voltage to the others of the inverting-side and non-inverting-side capacitors. In a holding phase of the input voltage, the control circuit connects a second end of the inverting-side capacitor of at least one capacitor pair to the non-inverting output terminal of the operational amplifier, connects a second end of the non-inverting-side capacitor of the at least one capacitor pair to the inverting output terminal of the operational amplifier, and applies the input voltage to at least one of the inverting-side and the non-inverting-side capacitors of the other capacitor pairs. A total capacitance of the inverting-side capacitors to which the input voltage is applied in the sampling phase is defined as $\alpha$. A total capacitance of the non-inverting-side capacitors to which the input voltage is applied in the sampling phase is defined as $\beta$. A total capacitance of the inverting-side capacitors to which the input voltage is applied in the holding phase is defined as $\gamma$. A total capacitance of the non-inverting-side capacitors to which the input voltage is applied in the holding phase is defined as $\eta$. $\alpha$ is substantially different from $\beta$. A total capacitance of the at least one capacitor pair is substantially equal to $(\alpha-\beta-\gamma+\eta)\cdot(N/2)$, where N is a positive number.

According to a second aspect of the present invention, a multiplying D/A converter includes the sample and hold circuit and an input terminal for receiving a digital value. In the sampling phase, the control circuit of the sample and hold circuit applies the input voltage to at least one of the inverting-side and non-inverting-side capacitors and a DAC voltage to at least one of the others of the inverting-side and non-inverting-side capacitors. The DAC voltage depends on the digital value.

According to a third embodiment of the present invention, an A/D converter includes the multiplying D/A converter, an A/D conversion section, and a unit conversion circuit. The A/D conversion section outputs an input digital value corresponding to a magnitude of the input voltage. The unit conversion circuit outputs a first residue voltage by doubling a difference between a D/A conversion value of the input digital value and a value obtained by multiplying the input voltage by 1/N. An operation in which the first residue voltage is inputted to the unit conversion circuit to cause the unit conversion circuit to output a second residue voltage is repeated a predetermined number of times to produce an A/D conversion code of the input voltage.

BRIEF DESCRIPTION OF THE DRAWINGS

The above and other objectives, features and advantages of the present invention will become more apparent from the following detailed description made with check to the accompanying drawings. In the drawings:

FIG. 4 is a diagram illustrating a capacitor to which an input voltage is applied in Case1-Case9;

FIG. 5 is a diagram illustrating values of $\alpha$, $\beta$, $\gamma$, $\eta$, $\alpha+\beta$, and $\gamma+\eta$ in Case1-Case9;

FIG. 6 is a diagram illustrating whether first through fourth conditions are met in Case1-Case9;

FIG. 7 is a diagram illustrating a capacitor to which an input voltage is applied in Case10-Case17 according to a second embodiment of the present invention;

FIG. 8 is a diagram illustrating values of $\alpha$, $\beta$, $\gamma$, $\eta$, $\alpha+\eta$, and $\beta+\gamma$ in Case10-Case17;

FIG. 9 is a diagram illustrating whether first, fourth, and fifth conditions are met in Case10-Case17;

FIG. 12A is a diagram illustrating values of $\alpha p$, $\beta p$, $\gamma p$, $\eta p$, $\alpha p+\beta p$, and $\gamma p+\eta p$ in Case18-Case20 as to a non-inverting input voltage, and FIG. 12B is a diagram illustrating whether first through three, fifth, and sixth conditions are met in Case18-Case20 as to the non-inverting input voltage;

FIG. 13A is a diagram illustrating values of $\alpha m$, $\beta m$, $\gamma m$, $\eta m$, $\alpha m+\beta m$, and $\gamma m+\eta m$ in Case18-Case20 as to an inverting input voltage, and FIG. 13B is a diagram illustrating whether first through three, and fifth conditions are met in Case18-Case20 as to the inverting input voltage;

FIG. 14A is a diagram illustrating whether a seventh condition is met in Case18-Case20 as to the non-inverting input voltage, and FIG. 14B is a diagram illustrating whether the seventh condition is met in Case18-Case20 as to the inverting input voltage;

DETAILED DESCRIPTION OF THE PREFERRED EMBODIMENTS

First Embodiment

A single-ended input sample and hold (S/H) circuit 1 according to a first embodiment of the present invention is described below with reference to FIGS. 1A-6. In the first embodiment, the S/H circuit 1 is applied to a multiplying D/A converter (MDAC).

Figure 1A:
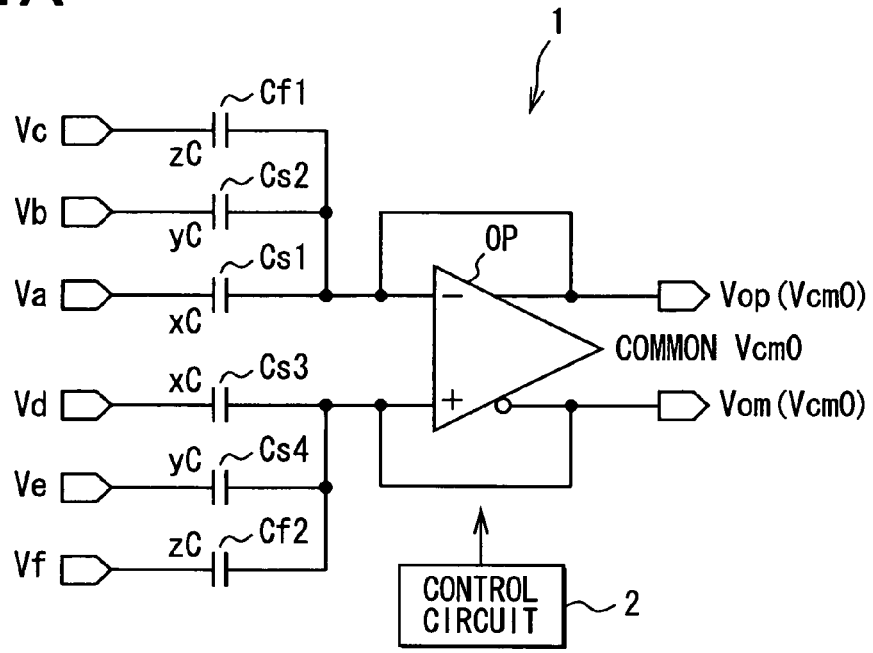
FIG. 1A is a diagram illustrating a sampling phase of a sample and hold circuit according to a first embodiment of the present invention.
Figure 1B:
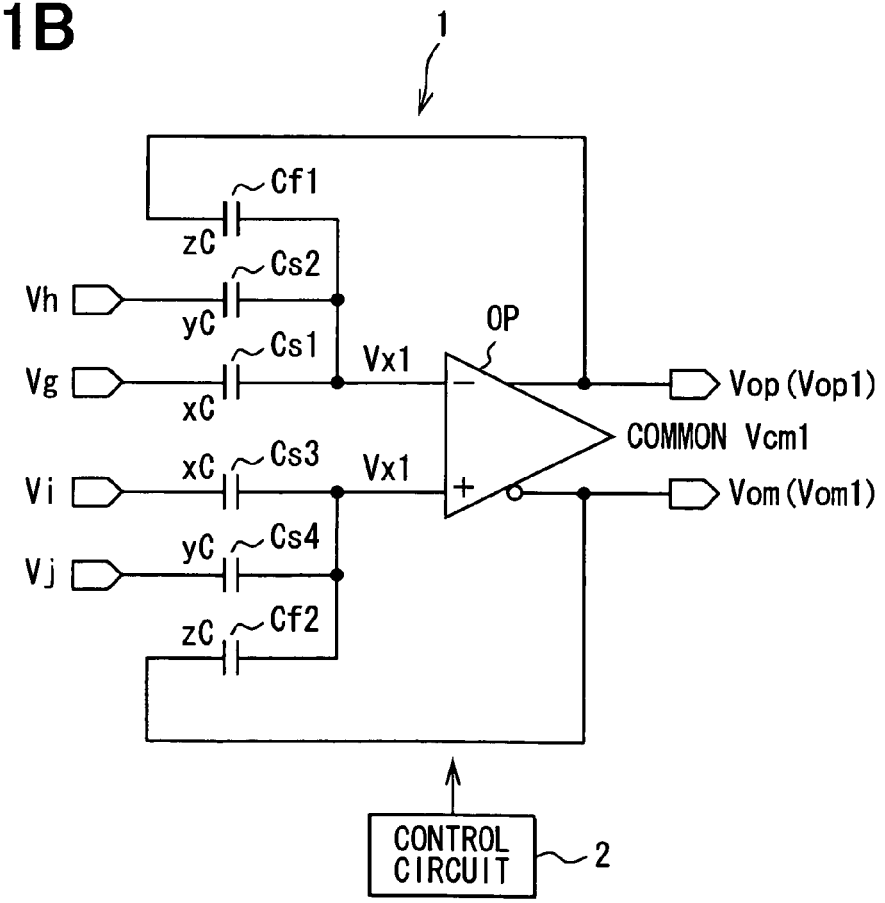
FIG. 1B is a diagram illustrating a holding phase of the sample and hold circuit according to the first embodiment.

As shown in FIGS. 1A and 1B, the S/H circuit 1 includes an operational amplifier (op-amp) OP and capacitors Cs1-Cs4, Cf1, and Cf2. FIG. 1A illustrates a sampling phase of the S/H circuit 1, and FIG. 1B illustrates a holding phase of the S/H circuit 1.

The op-amp OP has a sufficient large open loop gain and outputs a difference between holding voltages. A first end of each of the capacitors Cs1, Cs2, Cf1 (inverting-side capacitors) is coupled to an inverting input terminal (−) of the op-amp OP. A second end of each of the capacitors Cs3, Cs4, Cf2 (non-inverting-side capacitors) is coupled to a non-inverting input (+) of the op-amp OP. The capacitors Cs1, Cs2, Cf1 are paired with the capacitors Cs3, Cs4, Cf2, respectively. The paired capacitors Cs1, Cs3 have the same capacitance of xC, where x is a positive number, and C represents a unit capacitance. The paired capacitors Cs2, Cs4 have the same capacitance of yC, where y is a positive number, and C represents a unit capacitance. The paired capacitors Cf1, Cf2 have the same capacitance of zC, where z is a positive number, and C represents a unit capacitance. The capacitors Cf1, Cf2 serve as a feedback capacitor. A control circuit 2 controls connection states of the capacitors Cs1-Cs4, Cf1, Cf2 and application states of the voltage Va-Vj.

Figure 2:
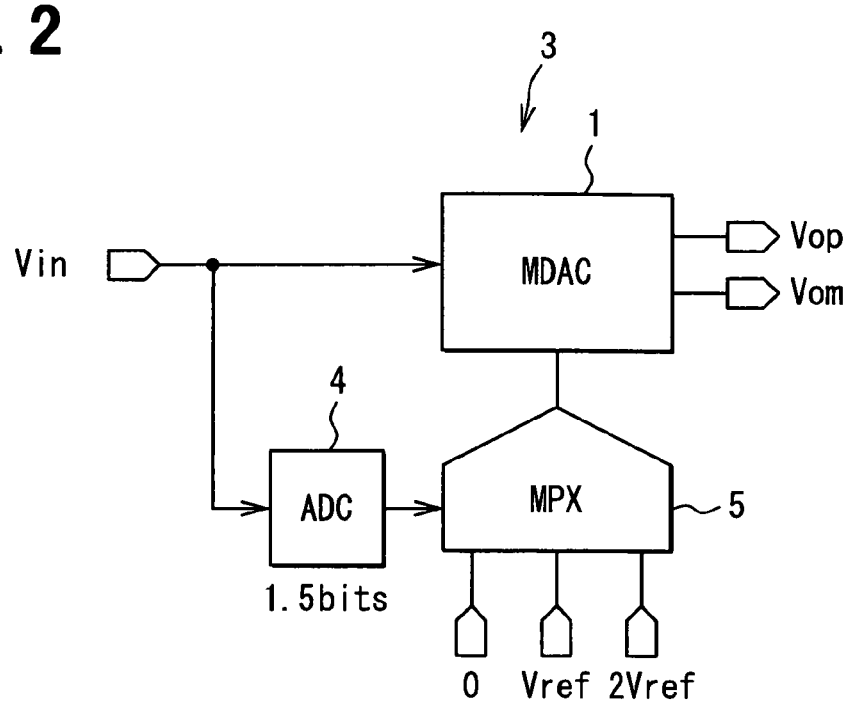
FIG. 2 is a diagram illustrating a unit conversion circuit constructed with the sample and hold circuit of FIGS. 1A and 1B.

FIG. 2 illustrates a unit conversion circuit 3 as a basic circuit used in, for example, an analog-to-digital (A/D) conversion stage of a pipeline A/D converter or a cyclic A/D converter. The unit conversion circuit 3 includes the S/H circuit 1 (labeled as MDAC in the drawings), a secondary A/D converter (labeled as ADC in the drawings) 4, and a multiplexer (labeled as MPX in the drawings) 5. The secondary A/D converter 4 performs a 1.5-bit A/D conversion of an input voltage Vin and outputs to the MPX 5 an A/D conversion value (i.e., input digital value) of one of three values +1, 0, and −1.

The MPX 5 outputs at least one analog voltage to the S/H circuit 1 according to the A/D conversion value received from the secondary A/D converter 4. In the S/H circuit 1, voltages Va-Vj is the same as any one of the input voltage Vin and the analog voltage. A combination of the S/H circuit 1 and the MPX 5 can be called as a multiplying D/A converter.

Ideally, the S/H circuit 1 produces and holds a differential output voltage Vop1−Vom1 given by the following equation (1):

$$Vop1 - Vom1 = 2\left(\frac{1}{N}Vin - Vref\right) - (\pm 1, 0)Vref \quad (1)$$

As can be seen from the equation (1), the input voltage Vin inputted to the S/H circuit 1 is multiplied by 1/N (N>0), a reference voltage Vref is subtracted from the voltage Vin/N, the voltage Vin/N−Vref is doubled to a voltage 2(Vin/N−Vref), and then a voltage (±1, 0)Vref depending on the A/D conversion value received from the MPX 5 is subtracted from the voltage 2(Vin/N−Vref). Specifically, when the A/D conversion value is "+1", the differential output voltage Vop1−Vom1 is given by the equation (2). When the A/D conversion value is "0", the differential output voltage Vop1−Vom1 is given by the equation (3). When the A/D conversion value is "−1", the differential output voltage Vop1−Vom1 is given by the equation (4).

$$+1 \ldots Vop1 - Vom1 = \frac{2}{N}Vin - Vref \quad (2)$$

$$0 \ldots Vop1 - Vom1 = \frac{2}{N}Vin - 2Vref \quad (3)$$

$$-1 \ldots Vop1 - Vom1 = \frac{2}{N}Vin - 3Vref \quad (4)$$

Figure 3:
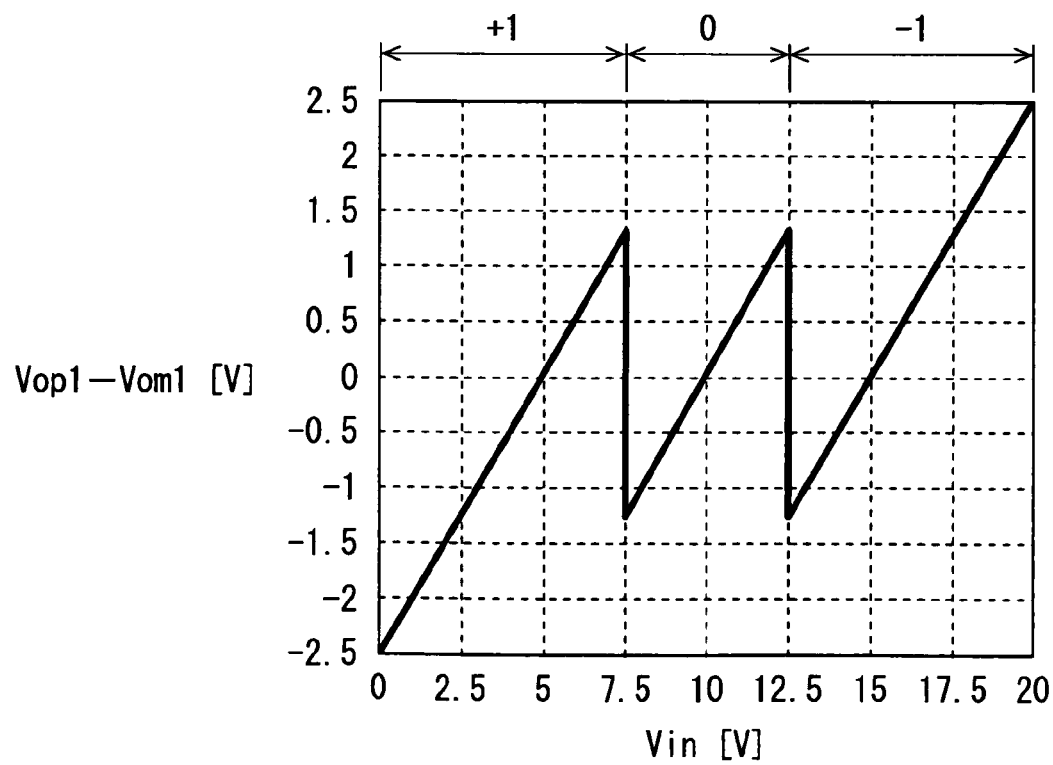
FIG. 3 is a diagram illustrating an input/output characteristic of the unit conversion circuit of FIG. 2.

FIG. 3 illustrates an input/output characteristic of the unit conversion circuit 3 observed when a power supply voltage is five volts, and N is four (N=4). According to the equation (1), the input voltage Vin is multiplied by ¼. Therefore, an input dynamic range of the input voltage Vin is increased to a range of 0 volts (V) to 20 V. As can be seen from FIG. 3, when 0≦Vin<7.5 V, the A/D conversion value is "+1". When 7.5≦Vin<12.5 V, the A/D conversion value is "0". And, when 12.5 V≦Vin<20 V, the A/D conversion value is "−1".

Below, it is assumed that an input voltage in the sampling phase is Vin, and that an input voltage in the holding phase is Vin+ΔV. The voltage ΔV represents a change in the input voltage between the sampling phase and the holding phase. In this case, the S/H circuit 1 is configured to have the following four characteristics (1A)-(1D).

(1A) A single ended input is converted to a differential output.

(1B) The input voltage Vin is applied to at least one capacitor in the sampling phase, and the input voltage Vin+ΔV is applied to at least one capacitor in the holding phase.

(1C) The input voltage Vin is multiplied by 1/N and then sampled. The sampled voltage Vin/N is doubled, and then held. The held voltage (i.e., differential output voltage Vop1−Vom1) does not depend on the input voltage Vin+ΔV in the holding phase.

(1D) An input voltage Vx1 (i.e., common input voltage) of the op-amp OP in the holding phase does not depend on the input voltage Vin in the sampling phase.

However, the characteristic (1D) and the latter of the characteristic (1C) can be omitted if unnecessary.

FIG. 1A illustrates a connection configuration of the S/H circuit 1 in the sampling phase. In the sampling phase, the op-amp OP is configured to serve as a voltage follower. Each of output voltages Vop, Vom respectively outputted from non-inverting and inverting output terminals of the op-amp OP becomes a common voltage Vcm0. To derive a general expression, it is assumed that voltages Va, Vb, Vc, Vd, Ve, and Vf are applied to the capacitors Cs1, Cs2, Cf1, Cs3, Cs4, and Cf2, respectively. At least one of the voltages Va, Vb, Vc, Vd, Ve, and Vf is the input voltage Vin, and the other voltages are constant voltages.

FIG. 1B illustrates a connection configuration of the S/H circuit 1 in the holding phase. In the holding phase, the second ends of at least one paired capacitors are connected to the non-inverting and inverting output terminals of the op-amp OP, respectively. However, it is noted that at least one of the capacitors Cs1, Cs2, Cf1, Cs3, Cs4, and Cf2 is configured not to serve as a feedback capacitor. To derive a general expression, it is assumed that the output voltages Vop, Vom of the op-amp OP are voltages Vop1, Vom1, respectively, and voltages Vg, Vh, Vi, and Vj are applied to the capacitors Cs1, Cs2, Cs3, and Cs4, respectively. At least one of the voltages Vg, Vh, Vi, and Vj is the input voltage Vin, and the other voltages are constant voltages.

The following four requirements Req1-4 need to be satisfied to allow the S/H circuit 1 to have the above-described characteristics (1A)-(1D).

[Req1]

An equation for the input voltage Vx1 of the op-amp OP in the holding phase has no term involving the input voltage Vin. It is noted that a term involving the change ΔV can be left in the equation for the input voltage Vx1.

[Req2]

An equation for the differential output voltage Vop1−Vom1 in the holding phase has no term involving the difference ΔV.

[Req3]

The equation for the differential output voltage Vop1−Vom1 in the holding phase has the term involving the input voltage Vin.

[Req4]

A coefficient of the term involving the input voltage Vin of the equation for the differential output voltage Vop1−Vom1 in the holding phase is 2/N.

As disclosed in U.S. Pat. No. 7,397,287, which is incorporated herein by reference, the differential output voltage Vop1−Vom1 is given by the following equation (5):

$$Vop1 - Vom1 = \frac{x\{(Va+Vi)-(Vd+Vg)\} + y\{(Vb+Vj)-(Vh+Ve)\}+z(Vc-Vf)}{z} \quad (5)$$

Likewise, the input voltage Vx1 of the op-amp OP is given by the following equation (6):

$$Vx1 = \frac{x\{(Vg+Vi)-(Va+Vd)\} + y\{(Vh+Vj)-(Vb+Ve)\}-z(Vc+Vf)}{2(x+y+z)} + Vcm0 + \frac{z}{x+y+z}Vcm1 \quad (6)$$

In the equations (5), (6), Vcm0 represents a common voltage of the output voltages Vop, Vom in the sampling phase, and Vcm1 represents a common voltage of the output voltages Vop1, Vom1 in the holding phase.

Here, it is defined as follows:

The total capacitance of the inverting-side capacitors to which the input voltage Vin is applied in the sampling phase is αC.

The total capacitance of the non-inverting-side capacitors to which the input voltage Vin is applied in the sampling phase is βC.

The total capacitance of the inverting-side capacitors to which the input voltage Vin+ΔV is applied in the holding phase is γC.

The total capacitance of the non-inverting-side capacitors to which the input voltage Vin+ΔV is applied in the holding phase is ηC.

In this case, the following three conditions Con1-3 need to be met to satisfy the above-described requirements Req1-3.

[Con1]

$$\alpha + \beta = \gamma + \eta \quad (7)$$

[Con2]

$$\gamma = \eta \quad (8)$$

[Con3]

$$\alpha \neq \beta \quad (9)$$

A fourth condition Con4 required to be met to satisfy the fourth requirement Req4 is derived as follows. In the equation (5), the voltages Va, Vb, Vc applied to the inverting-side capacitors in the sampling phase are added to the voltages Vi, Vj applied to the non-inverting-side capacitors in the holding phase, and the voltages Vd, Ve, Vf applied to the non-inverting-side capacitors in the sampling phase are subtracted from the voltages Vg, Vh applied to the inverting-side capacitors in the holding phase. Therefore, a coefficient of the term involving the input voltage Vin is given by the following equation (10) using α, β, γ, and η:

The coefficient of the term of $Vin = (\alpha - \beta - \gamma + \eta)/z$ (10)

On the other hand, the coefficient of the term involving the input voltage Vin of the equations (1)-(4) governing the differential output voltage Vop1−Vom1 is 2/N. Therefore, the fourth condition Con4 is given by the following equation (11):

[Con4]

$$(\alpha - \beta - \gamma + \eta)/z = 2/N$$

$$z = (\alpha - \beta - \gamma + \eta) \cdot (N/2) \quad (11)$$

When two or more feedback capacitor pairs are used, a capacitance of each feedback capacitance pair is defined as z1C, z2C, ..., where z1, z2, ... is a positive number, and C is a unit capacitance. In this case, "z" in the left side of the equation (11) is represented as z1+z2+..., which is the sum of the capacitances of each feedback capacitance pair. By the way, the conditions Con1-Con4 are analytically derived. Therefore, some variations in the conditions Con1-Con4 caused by unavoidable manufacturing variations can be allowed as describe in the sixth embodiment later.

The present inventors have conducted an experiment to determine whether each of the following cases Case1-Case9 satisfies the conditions Con1-Con4. The cases Case1-Case9 are disclosed in U.S. Pat. No. 7,397,287, which is incorporated herein by reference.

[Case1]
The voltage Vc is the input voltage Vin, each of the voltages Vg, Vi is the input voltage Vin+ΔV, and z=2x.

[Case2]
The voltage Vc is the input voltage Vin, each of the voltages Vg, Vi, Vh, Vj is the input voltage Vin+ΔV, and z=2x+2y.

[Case3]
The voltage Va is the input voltage Vin, each of the voltages Vh, Vj is the input voltage Vin+ΔV, and x=2y.

[Case4]
Each of the voltages Va, Vb is the input voltage Vin, each of the voltages Vg, Vj is the input voltage Vin+ΔV, and x=y.

[Case5]
Each of the voltages Va, Vb is the input voltage Vin, each of the voltages Vg, Vi is the input voltage Vin+ΔV.

[Case6]
Each of the voltages Va, Vc is the input voltage Vin, each of the voltages Vh, Vj is the input voltage Vin+ΔV, and x+z=2y.

[Case7]
Each of the voltages Vc, Vd is the input voltage Vin, each of the voltages Vh, Vj is the input voltage Vin+ΔV, and x+z=2y.

[Case8]
Each of the voltages Va, Vc, Vd is the input voltage Vin, each of the voltages Vh, Vj is the input voltage Vin+ΔV, and 2x+z=2y.

[Case9]
Each of the voltages Va, Vc, Vd is the input voltage Vin, each of the voltages Vg, Vi, Vh, Vj is the input voltage Vin+ΔV, and z=2y.

FIGS. 4-6 illustrate the result of the experiment. FIG. 4 illustrates the capacitors to which the input voltage Vin is applied in the sampling phase of the S/H circuit 1 and also illustrates the capacitors to which the input voltage Vin+ΔV is applied to the holding phase of the S/H circuit 1. In FIG. 4, the input voltage Vin or Vin+ΔV is applied to the capacitors indicated by a black circle. FIG. 5 illustrates the values of α, β, γ, η, α+β, and γ+η for each case. FIG. 6 illustrates whether the conditions Con1-3 are met. Further, FIG. 6 illustrates the value of α−β−γ+η, the coefficient of the term involving the input voltage Vin given by the equation (10), and a capacitance ratio x:y:z required to reduce the input voltage Vin to 1/N for the fourth condition Con4. In FIG. 6, "OK" means the corresponding condition is met, and "NG" means the corresponding condition is not met.

As can be seen from FIG. 6, the case Case5 does not meet the fourth condition Con4, because the coefficient of the term involving the input voltage Vin (i.e., (α−β−γ+η)/z) becomes zero. In each of the cases Case1, 2, 8, 9, since the coefficient of the term involving the input voltage Vin (i.e., (α−β−γ+η)/z) becomes one, the fourth condition Con4 is met only when N=2. As a result, in each of the cases Case1, Case2, Case8, and Case9, the input voltage Vin is divided by a division ratio of 1/2 only. In each of the cases Case3, Case4, Case6, and Case7, the input voltage Vin can be divided by any given division ratio by setting the capacitance ratio x:y:z as follows:

(Case3) x:y:z=2:1:N
(Case4) x:y:z=1:1:N
(Case6) x:y:z=2−N:1:N
(Case7) x:y:z=N−2:N−1:N As described above, according to the S/H circuit 1 of the first embodiment, the inverting-side capacitors Cs1, Cs2, Cf1 are connected to the inverting input terminal of the op-amp OP, and the non-inverting-side capacitors Cs3, Cs4, Cf2 are connected to the non-inverting input terminal of the op-amp OP. The inverting-side capacitors Cs1, Cs2, Cf1 are pared with the non-inverting-side capacitors Cs3, Cs4, Cf2, respectively. In the sampling phase, the op-amp OP serves as a voltage follower, and the input voltage Vin is applied to at least one capacitor. In the holding phase, at least one pair of the inverting-side capacitor and the non-inverting-side capacitor is connected between the input and output terminals of the op-amp OP to serve as a feedback capacitor, and the input voltage Vin+ΔV is applied to at least one capacitor.

In this configuration, when the fourth condition Con4 is met, the S/H circuit 1 can perform the sampling phase by dividing the input voltage Vin by a divisional ratio of 1/N. Accordingly, the input voltage dynamic range of the S/H circuit 1 can be increased. Therefore, for example, when the S/H circuit 1 is used in an on-board device or a motor control device, a battery voltage or a motor voltage above a power supply voltage can be directly inputted without a voltage divider circuit. As a result, the on-board device or the motor control device can be reduced in size. Typically, since a capacitance ratio can be accurately adjusted compared to a resistance ratio, the S/H circuit 1 can divide the input voltage Vin accurately.

Since the first condition Con1 is met, the input voltage Vx1 of the op-amp OP is kept at a predetermined common input voltage (i.e., bias voltage) so that the op-amp OP can work at a desired gain and slew rate. Further, according to the first embodiment, the second condition Con2 and the third condition, Con3 are met. Therefore, even when the input voltage Vin changes during the holding phase (i.e., even when the change $\Delta V$ is not zero), the sampled single-ended voltage Vin can be accurately converted to the differential output voltage Vop1−Vom1 and then held.

When at least the third condition Con3 and the fourth condition Con4 are met, the S/H circuit 1 can perform the sampling phase by dividing the input voltage Vin by the divisional ratio of 1/N. Therefore, the first condition Con1 and the second condition Con2 can be omitted if unnecessary.

Second Embodiment

A second embodiment of the present invention is described below with reference to FIGS. 7-9. Differences between the first and second embodiments are as follows. A S/H circuit 1 of the second embodiment has the same structure as the S/H circuit 1 of the first embodiment. However, a manner in which the input voltage Vin, Vin+$\Delta V$ is applied to the S/H circuit 1 is different between the first and second embodiments. Further, the setting of the capacitance ratio x:y:z is different between the first and second embodiments.

In the second embodiment, the S/H circuit 1 is configured to have the following four characteristics (2A)-(2D).

(2A) A single ended input is converted to a differential output.

(2B) The input voltage Vin is applied to at least one capacitor in the sampling phase, and the input voltage Vin+$\Delta V$ is applied to at least one capacitor in the holding phase.

(2C) The input voltage Vin is multiplied by 1/N and then sampled. The sampled voltage Vin/N is doubled, and then held. The held voltage (i.e., differential output voltage Vop1−Vom1) depends on the change $\Delta V$, which is a change in the input voltage Vin between the sampling and holding phase.

(2D) An input voltage Vx1 of the op-amp OP in the holding phase does not depend on the input voltage Vin in the sampling phase.

Even when the characteristic (2C) is achieved, an influence of the change $\Delta V$ on the differential output voltage Vop1−Vom1 appears. Therefore, the holding phase is not perfect. However, when the input voltage Vin is limited to a predetermined voltage range, the S/H circuit 1 can practically serve as a sample and hold circuit by setting the coefficient of the term involving the change $\Delta V$ as small as possible.

The following three requirements Req1, Req4, and Req5 need to be met to allow the S/H circuit 1 to have the above-described characteristics (2A)-(2D).

[Req1]

An equation for the input voltage Vx1 of the op-amp OP in the holding phase has no term involving the input voltage Vin. It is noted that a term involving the change $\Delta V$ can be left in the equation for the input voltage Vx1.

[Req4]

A coefficient of the term involving the input voltage Vin of the equation for the differential output voltage Vop1−Vom1 in the holding phase is 2/N.

[Req5]

The equation for the differential output voltage Vop1−Vom1 in the holding phase has both the term involving the input voltage Vin and the term involving the change $\Delta V$.

As described in the first embodiment, the first and fourth conditions Con1, Con4 need to be met to satisfy the requirements Req1, Req4. The fifth condition Con5 needs to be met to satisfy the fifth requirement Req5.

[Con5]

$$\alpha + \eta \neq \beta + \gamma \tag{12}$$

By the way, the following equation (13) as a condition Con5A can be derived by adding the equation (12) to the equation (7).

[Con5A]

$$\alpha \neq \gamma \tag{13}$$

Further, the following equation (14) as a condition Con5B can be derived by subtracting the equation (12) from the equation (7).

[Con5B]

$$\beta \neq \eta \tag{14}$$

Therefore, the fifth condition Con5 can be represented by the equations (13), (14) instead of the equation (12). By the way, since these conditions are analytically derived, some variations in these conditions caused by unavoidable manufacturing variations can be allowed.

The present inventors have conducted an experiment to determine whether each of the following cases Case10-Case17 satisfies the conditions Con1, Con4, and Con5. The cases Case10-Case17 are disclosed in U.S. Pat. No. 7,397, 287, which is incorporated herein by reference.

[Case10]

The voltage Vc is the input voltage Vin, each of the voltages Vi, Vj is the input voltage Vin+$\Delta V$, and z=x+y.

[Case11]

The voltage Vc is the input voltage Vin, the voltage Vi is the input voltage Vin+$\Delta V$, and z=x.

[Case12]

The voltage Va is the input voltage Vin, and the voltage Vi is the input voltage Vin+$\Delta V$.

[Case13]

Each of the voltages Va, Vb is the input voltage Vin, and each of the voltages Vi, Vj is the input voltage Vin+$\Delta V$.

[Case14]

Each of the voltages Va, Vb is the input voltage Vin, and each of the voltages Vi, Vh is the input voltage Vin+$\Delta V$.

[Case15]

Each of the voltages Va, Vb is the input voltage Vin, the voltage Vj is the input voltage Vin+$\Delta V$, and 2x=y.

[Case16]

Each of the voltages Va, Vc is the input voltage Vin, the voltage Vj is the input voltage Vin+$\Delta V$, and x+z=y.

[Case17]

Each of the voltages Vc, Vd is the input voltage Vin, the voltage Vj is the input voltage Vin+$\Delta V$, and x+z=y.

FIGS. 7-9 illustrate the result of the experiment. FIG. 7 illustrates the capacitors to which the input voltage Vin is applied in the sampling phase of the S/H circuit 1 and also illustrates the capacitors to which the input voltage Vin+$\Delta V$ is applied to the holding phase of the S/H circuit 1. In FIG. 7, the input voltage Vin or Vin+$\Delta V$ is applied to the capacitors indicated by a black circle.

FIG. 8 illustrates the values of $\alpha$, $\beta$, $\gamma$, $\eta$, $\alpha+\eta$, and $\beta+\gamma$ for each case. FIG. 9 illustrates whether the conditions Con1, Con5 are met. Further, FIG. 9 illustrates the value of $\alpha-\beta-\gamma+\eta$, the coefficient of the term involving the input voltage Vin given by the equation (10), and a capacitance ratio x:y:z required to reduce the input voltage Vin to 1/N for the fourth condition Con4. In FIG. 9, "OK" means the corresponding condition is met, and "NG" means the corresponding condition is not met.

As can be seen from FIG. 9, in each of the cases Case10, Case11, and Case17, since the coefficient of the term involving the input voltage Vin (i.e., $(\alpha-\beta-\gamma+\eta)/z$) becomes two, the fourth condition Con4 is met only when N=1. That is, in each of the cases Case10, Case11, and Case17, the S/H circuit 1 cannot perform the sampling phase by dividing the input voltage Vin. On the other hand, in each of the cases Case12-Case16, the input voltage Vin can be divided by any given division ratio by setting the capacitance ratio x:y:z as follows:

(Case12) x:y:z=1:1:N
(Case13) x:y:z=1:1:2 N
(Case14) x:y:z=1:1:N
(Case15) x:y:z=1:2:N
(Case16) x:y:z=1-N:1:N As described above, the S/H circuit 1 according to the second embodiment can perform the sampling phase by dividing the input voltage Vin by a divisional ratio of 1/N. Since the first condition Con1 is met, the op-amp OP can work at a desired gain and slew rate. Further, according to the second embodiment, the fifth condition Con5 is met. Therefore, the input voltage Vin is limited to a predetermined voltage range so that an influence of the difference $\Delta V$ on the differential output voltage Vop1–Vom1 can be reduced. Therefore, the S/H circuit 1 can remain held the sampled voltage accurately.

Third Embodiment

A sample and hold (S/H) circuit 10 according to a third embodiment of the present invention is described below with reference to FIGS. 10-14.

Although the S/H circuit 10 has the same structure as the S/H circuit 1 shown in FIG. 1, a differential input voltage is applied to the S/H circuit 10. In the description below, Vref represents a common mode voltage, Vinp represents a non-inverting input voltage in a sampling phase, Vinm represents an inverting input voltage in the sampling phase, Vinp' represents a non-inverting input voltage in a holding phase, Vinm' represents an inverting input voltage in the holding phase, Vin+$\Delta V$ represents a differential mode voltage in the holding phase, and Vref+$\Delta$Vref represents a common mode voltage in the holding phase.

Figures 10, 11:
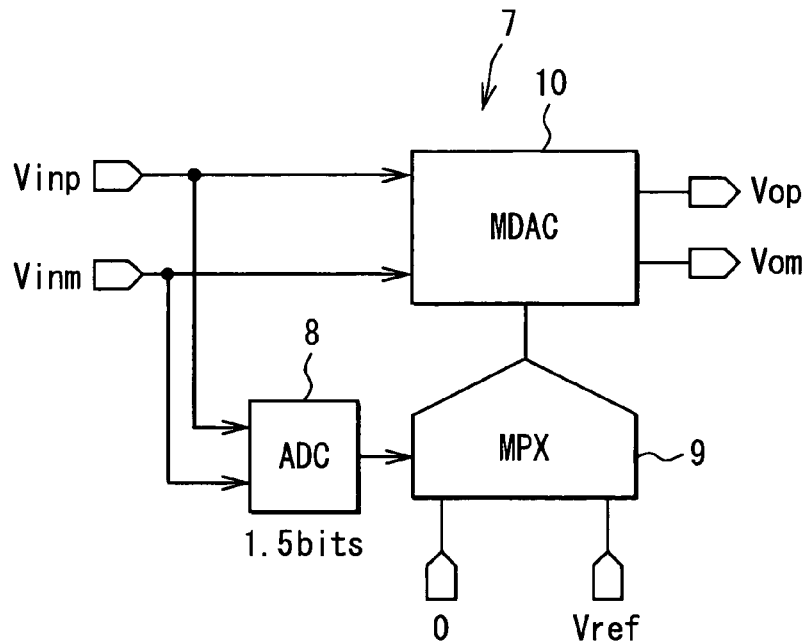
FIG. 10 is a diagram illustrating a unit conversion circuit according to a third embodiment of the present invention.
FIG. 11 is a diagram illustrating a capacitor to which an input voltage is applied in Case18-Case20.

FIG. 10 illustrates a unit conversion circuit 7 as a basic circuit used in, for example, an analog-to-digital (A/D) conversion stage of a pipeline A/D converter or a cyclic A/D converter. The unit conversion circuit 7 includes the S/H circuit 10, a secondary A/D converter (ADC) 8, and a multiplexer (MPX) 9. The secondary A/D converter 8 performs a 1.5-bit A/D conversion of each of the input voltages Vinp, Vinm and outputs to the MPX 9 an A/D conversion value of one of three values +1, 0, and −1.

The MPX 9 outputs at least one analog voltage to the S/H circuit 10 according to the A/D conversion value received from the secondary A/D converter 8. In the S/H circuit 10, each of voltages Va-Vj is the same as any one of the input voltages Vinp, Vinm, and the analog voltage. A combination of the S/H circuit 10 and the MPX 9 can be called as a multiplying D/A converter.

Ideally, the S/H circuit 10 produces and holds a differential output voltage Vop1–Vom1 given by the following equation (15):

$$Vop1 - Vom1 = 2\frac{Vinp - Vinm}{N} - (\pm 1, 0)Vref \qquad (15)$$

As can be seen from the equation (15), the differential input voltage Vinp–Vinm inputted to the S/H circuit 10 is multiplied by 2/N (N>0), and then a voltage (+1, 0)Vref depending on the A/D conversion value received from the MPX 9 is subtracted from the voltage 2(Vinp–Vinm)/N. Specifically, when the A/D conversion value is "+1", the differential output voltage Vop1–Vom1 is given by the equation (16). When the A/D conversion value is "0", the differential output voltage Vop1–Vom1 is given by the equation (17). When the A/D conversion value is "−1", the differential output voltage Vop1–Vom1 is given by the equation (18).

$$+1 \ldots Vop1 - Vom1 = 2\frac{Vinp - Vinm}{N} - Vref \qquad (16)$$

$$0 \ldots Vop1 - Vom1 = 2\frac{Vinp - Vinm}{N} \qquad (17)$$

$$-1 \ldots Vop1 - Vom1 = 2\frac{Vinp - Vinm}{N} + Vref \qquad (18)$$

The S/H circuit 10 is configured to have the following four characteristics (3A)-(3D). However, the characteristic (3D) and the latter of the characteristic (3C) can be omitted if unnecessary.

(3A) A differential input is converted to a differential output.

(3B) Each the inverting input voltage Vinm and the non-inverting input voltage Vinp is applied to at least one capacitor in the sampling phase, and each the inverting input voltage Vinm' and the non-inverting input voltage Vinp' is applied to at least one capacitor in the holding phase.

(3C) The differential input voltage Vinp–Vinm is multiplied by 1/N and then sampled. The sampled voltage (Vinp–Vinm)/N is doubled, and then held. The held voltage (i.e., differential output voltage Vop1–Vom1) does not depend on each of the inverting input voltage Vinm' and the non-inverting input voltage Vinp' (i.e., (i.e., the differential mode voltage Vin+$\Delta V$ and the common mode voltage Vref+$\Delta$Vref) in the holding phase.

(3D) An input voltage Vx1 of the op-amp OP in the holding phase does not depend on each of the inverting input voltage Vinm and the non-inverting input voltage Vinp (i.e., the differential mode voltage Vin and the common mode voltage Vref) in the sampling phase.

The third embodiment employs the differential input. However, when the inverting input voltage Vim and the non-inverting input voltage Vinp are separately considered, the conditions described in the first and second embodiments employing the single-ended input are required. That is, when based on the first embodiment, the conditions Con1-Con3 are required for each of the inverting input voltage Vinm and the non-inverting input voltage Vinp. However, the conditions Con1, Con2 can be omitted if unnecessary. On the other hand, when based on the second embodiment, the conditions Con1, Con5 (i.e., Con5A and Con5B) are required for each of the inverting input voltage Vinm and the non-inverting input voltage Vinp.

Further, in a case of the differential input, the equation for the differential output voltage Vop1−Vom1 in the holding phase has the term involving the differential input voltage Vinp−Vinm. Therefore, in the equation (5), the coefficient of the term involving the inverting input voltage Vinm and the coefficient of the term involving the non-inverting input voltage Vinp need to have the same absolute value and opposite signs. That is, the sixth condition Con6 below needs to be met.

[Con6]

$$\alpha p - \beta p = \beta m - \alpha m \quad (19)$$

Here, it is defined as follows:

The total capacitance of the inverting-side capacitors to which the non-inverting input voltage Vinp is applied in the sampling phase is $\alpha pC$.

The total capacitance of the non-inverting-side capacitors to which the non-inverting input voltage Vinp is applied in the sampling phase is $\beta pC$.

The total capacitance of the inverting-side capacitors to which the non-inverting input voltage Vinp' is applied in the holding phase is $\gamma pC$.

The total capacitance of the non-inverting-side capacitors to which the non-inverting input voltage Vinp' is applied in the holding phase is $\eta pC$.

The total capacitance of the inverting-side capacitors to which the inverting input voltage Vinm is applied in the sampling phase is $\alpha mC$.

The total capacitance of the non-inverting-side capacitors to which the inverting input voltage Vinm is applied in the sampling phase is $\beta mC$.

The total capacitance of the inverting-side capacitors to which the inverting input voltage Vinm' is applied in the holding phase is $\gamma mC$.

The total capacitance of the non-inverting-side capacitors to which the inverting input voltage Vinm' is applied in the holding phase is $\eta mC$.

Further, the fourth condition Con4 according to the third embodiment is that the coefficient of the term involving the differential input voltage Vinp−Vinm of the equation for the differential output voltage Vop1−Vom1 in the holding phase is 2/N. The coefficient of the term involving the non-inverting input voltage Vinp of the equation (5), which governs the differential output voltage Vop1−Vom1, is given by the following equation (20) using $\alpha$, $\beta$, $\gamma$, and $\eta$. The coefficient of the term involving the inverting input voltage Vinm of the equation (5) is given by the following equation (21) using $\alpha$, $\beta$, $\gamma$, and $\eta$.

The coefficient of the term of $Vinp = (\alpha p - \beta p - \gamma p + \eta)/z$ (20)

The coefficient of the term of $Vinm = (\alpha m - \beta m - \gamma m + \eta m)/z$ (21)

When the sixth condition Con6 is met, the term involving the differential input voltage Vinp−Vinm of the equation (5) governing the differential output voltage Vop−Vom1 is given by the following equation (22):

The term involving the differential input voltage
$Vinp - Vinm = (\alpha p - \beta p - \gamma p + \eta p)/z = -(\alpha m - \beta m - \gamma m + \eta m)/z$ (22)

On the other hand, the coefficient of the term involving the differential input voltage Vinp−Vinm of the equations (15)-(18) governing the differential output voltage Vop1−Vom1 is 2/N. Therefore, a seventh condition Con7 given by the following equation (23) needs to be met to satisfy the fourth requirement Req4. By the way, since these conditions are analytically derived, some variations in these conditions caused by unavoidable manufacturing variations can be allowed.

$$\frac{\alpha p - \beta p - \gamma p + \eta p}{z} = \frac{-(\alpha m - \beta m - \gamma m + \eta m)}{z} = \frac{2}{N} \quad (23)$$

$$z = \frac{\alpha p - \beta p - \gamma p + \eta p}{2} N = \frac{-(\alpha m - \beta m - \gamma m + \eta m)}{2} N$$

The present inventors have conducted an experiment to determine whether each of the following cases Case18-Case20 satisfies the conditions Con1-Con3, and Con5-Con7. The cases Case18-Case20 are disclosed in U.S. Pat. No. 7,397,287, which is incorporated herein by reference.

[Case 18]

The voltage Vf is the inverting input voltage Vinm, the voltage Vc is the non-inverting input voltage Vinp, the voltage Vg is the inverting input voltage Vinm', the voltage Vi is the non-inverting input voltage Vinp', and x=z.

[Case19]

The voltage Vf is the inverting input voltage Vinm, the voltage Vc is the non-inverting input voltage Vinp, each of the voltages Vg, Vi is the inverting input voltage Vinm', each of the voltages Vh, Vj is the non-inverting input voltage Vinp', and 2x=2y=z.

[Case20]

The voltage Vd is the inverting input voltage Vinm, the voltage Va is the non-inverting input voltage Vinp, the voltage Vh is the inverting input voltage Vinm', the voltage Vj is the non-inverting input voltage Vinp', and x=y.

FIGS. 11-14 illustrate the result of the experiment. FIG. 11 illustrates the capacitors to which the non-inverting input voltage Vinp is applied in the sampling and holding phases of the S/H circuit 10 and also illustrates the capacitors to which the inverting input voltage Vinm is applied to the sampling and holding phases of the S/H circuit 10. In FIG. 11, the non-inverting input voltage Vinp is applied to the capacitors indicated by a black circle, and the inverting input voltage Vinm is applied to the capacitors indicated by a white circle. FIG. 12A illustrates the values of $\alpha p$, $\beta p$, $\gamma p$, $\eta p$, $\alpha p + \eta p$, and $\gamma p + \eta p$ for each case as to the non-inverting input voltage Vinp. FIG. 12B illustrates whether the conditions Con1-Con3, Con5, and Con6 are met as to the non-inverting input voltage Vinp. FIG. 13A illustrates the values of $\alpha m$, $\beta m$, $\gamma m$, $\eta m$, $\alpha m + \eta m$, and $\gamma m + \eta m$ for each case as to the inverting input voltage Vinm. FIG. 13B illustrates whether the conditions Con1-Con3, and Con5 are met as to the inverting input voltage Vinm.

FIG. 14A illustrates whether the seventh condition Con7 is met as to the non-inverting input voltage Vinp. FIG. 14A illustrates the value of $\alpha p - \beta p - \gamma p + \eta p$, the coefficient of the term involving the non-inverting input voltage Vinp given by the equation (20), the coefficient of the term involving the differential input voltage Vinp−Vinm given by the equation (22), and a capacitance ratio x:y:z required to reduce the differential input voltage Vinp−Vinm to 1/N. FIG. 14B illustrates whether the seventh condition Con7 is met as to the inverting input voltage Vinm. FIG. 14B illustrates the value of $\alpha m - \beta m - \gamma m + \eta m$ and the coefficient of the term involving the inverting input voltage Vinm given by the equation (21).

In the case Case18, the coefficient of the term involving the differential input voltage Vinp−Vinm becomes two so that N becomes one (i.e., N=1), when x=z to meet the first condition Con1. Therefore, in the case Case18, the S/H circuit 10 cannot perform the sampling phase by dividing the differential input voltage Vinp-Vinm. In the case Case19, the coefficient of the term involving the differential input voltage Vinp-Vinm becomes one so that N becomes two (i.e., N=2), when 2y=z to meet the first condition Con1. Therefore, in the case Case19, the S/H circuit 10 can perform the sampling phase by dividing the differential input voltage Vinp-Vinm by a divisional ratio of 1/2 only. In the case Case20, the coefficient of the term involving the differential input voltage Vinp-Vinm becomes 2×/z, when z=y to meet the first condition Con1. Therefore, in the case Case20, the differential input voltage Vinp-Vinm can be divided by a given division ratio of 1/N by setting the capacitance ratio x:y:z to 1:1:N.

As described above, according to the third embodiment, the first through third conditions Con1-Con3 are met for each of the inverting and non-inverting input voltages Vinm, Vinp. Further, since the sixth and seventh conditions Con6, Con7 are met, the S/H circuit 10 can perform the sampling phase by dividing the differential input voltage Vinp-Vinm by a divisional ratio of 1/N. However, the first and second conditions Con1, Con2 can be omitted if unnecessary. When the fifth condition Con5 (Con5A, Con5B) instead of the second and third conditions Con2, Con3 is met, the differential input voltage Vinp-Vinm is limited to a predetermined voltage range so that an influence of the difference ΔV on the differential output voltage Vop1-Vom1 can be reduced. Therefore, the S/H circuit 10 can remain held the sampled voltage accurately.

Fourth Embodiment

A fourth embodiment of the present invention is described below with reference to FIGS. 15A, 15B. In the fourth embodiment, the case Case4 relating to the single-ended input is described in detail.

Figure 15A:
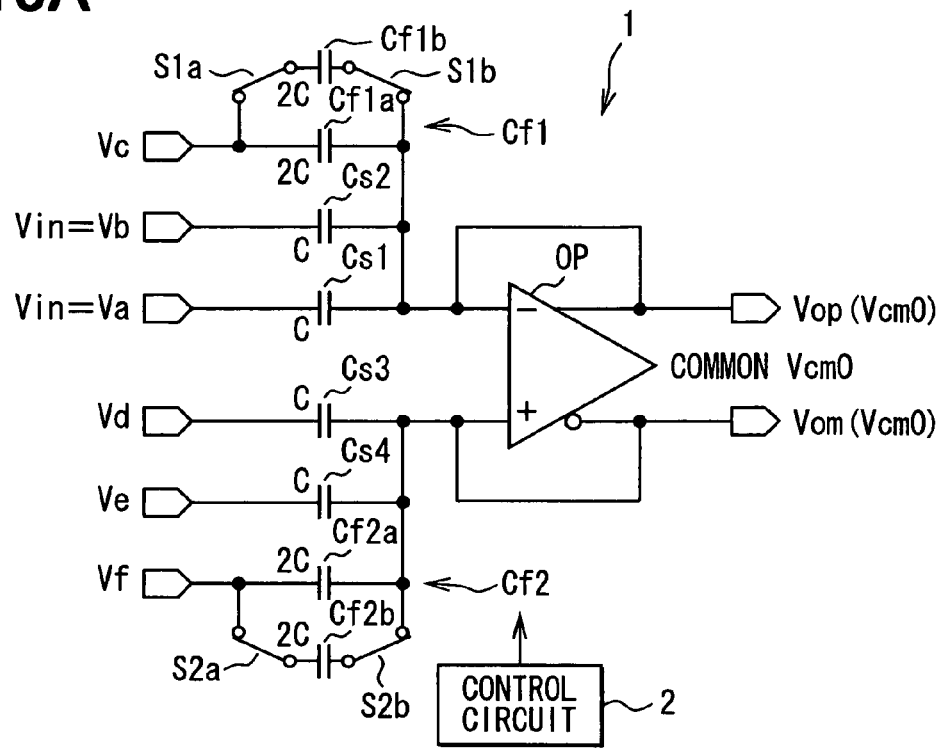
FIG. 15A is a diagram illustrating a sampling phase of a sample and hold circuit according to a fourth embodiment of the present invention.
Figure 15B:
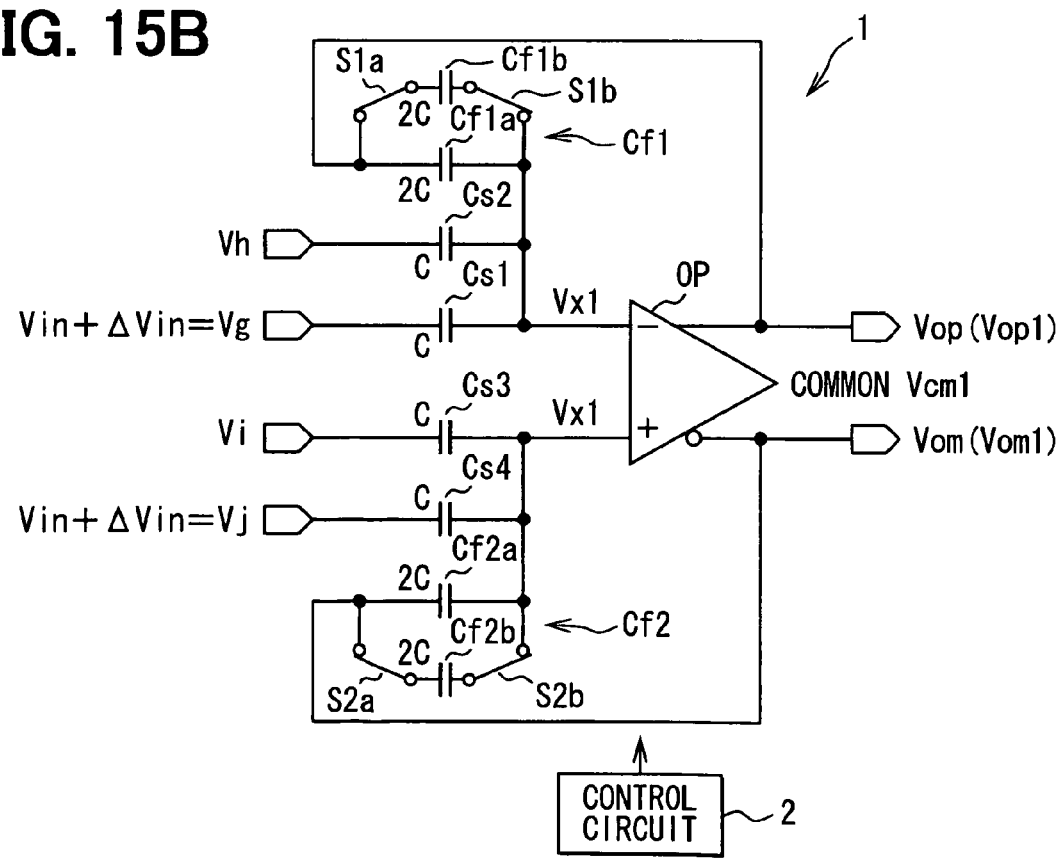
FIG. 15B is a diagram illustrating a holding phase of the sample and hold circuit according to the fourth embodiment.

FIG. 15A illustrates a connection configuration of the S/H circuit 1 in the sampling phase. FIG. 15B illustrates a connection configuration of the S/H circuit 1 in the holding phase. Each of the capacitors Cs1, Cs2, Cs3, and Cs4 has the same capacitance of C. The capacitor Cf1 is constructed with two capacitors Cf1a, Cf1b having the same capacitance of 2C. The capacitors Cf1a, Cf1b are connected in parallel to each other through switches S1a, S1b. The capacitor Cf1b can be electrically disconnected from the S/H circuit 1 by switching the switches S1a, S1b. The capacitor Cf2 is constructed with two capacitors Cf2a, Cf2b having the same capacitance of 2C. The capacitors Cf2a, Cf2b are connected in parallel to each other through switches S2a, S2b. The capacitor Cf2b can be electrically disconnected from the S/H circuit 1 by switching the switches S2a, S2b. The application of the voltage to the capacitors and the switching of the switches S1a, S1b, S2a, S2b are performed by the control circuit 2.

When Va=Vb=Vg=Vj=Vin, and x:y:z=1:1:N, the differential output voltage Vop1-Vom1 in the holding phase is given by the equation (24), and the input voltage Vx of the op-amp OP is given by the equation (25).

$$Vop1 - Vom1 = \frac{2}{N}Vin + \frac{Vi - Vd - Vh - Ve}{N} + Vc - Vf \quad (24)$$

$$Vx1 = \frac{N(Vc + Vf)}{2(2 + N)} + Vcm0 + \frac{N}{2+N}Vcm1 \quad (25)$$

When the switches S1a, S1b, S2a, and S2b are switched ON so that N=4, the equations (24), (25) become the following equations (26), (27), respectively.

$$Vop1 - Vom1 = \frac{1}{2}Vin + \frac{Vi - Vd - Vh - Ve}{4} + Vc - Vf \quad (26)$$

$$Vx1 = \frac{Vi - Vd + Vh - Ve}{12} - \frac{Vc + Vf}{3} + Vcm0 + \frac{2}{3}Vcm1 \quad (27)$$

When the S/H circuit 1 of the fourth embodiment is applied to the unit conversion circuit 3 shown in FIG. 2, the voltages Vc-Vf, Vh, Vi need to be set as follows to allow the equation (26) to match the equations (2)-(4) in a case where N=4. Here, it is defined that Vrefp=5 V (power supply voltage), Vref=2.5 V (median of power supply voltage), Vrefm=0 V, and Vcm0=Vcm1=Vref=2.5 V.

<In a Case where the A/D Conversion Value=+1>
The voltages Vc-Vf, Vh, Vi are set as follows to allow the equation (2) to be met: Vd=Ve=Vrefp, Vc=Vf=Vh=Vi=Vrefm In this case, the input voltage Vx1 of the op-amp OP is given by the following equation (28):

$$Vx1 = -\frac{1}{3}Vref + Vcm0 + \frac{2}{3}Vcm1 = 3.333[V] \quad (28)$$

<In a Case where the A/D Conversion Value=0>
The voltages Vc-Vf, Vh, Vi are set as follows to allow the equation (3) to be met: Vf=Vrefp, Vc=Vd=Ve=Vh=Vi=Vrefm In this case, the input voltage Vx1 of the op-amp OP is given by the following equation (29):

$$Vx1 = -\frac{2}{3}Vref + Vcm0 + \frac{2}{3}Vcm1 = 2.5[V] \quad (29)$$

<In a Case where the A/D Conversion Value=-1>
The voltages Vc-Vf, Vh, Vi are set as follows to allow the equation (4) to be met: Vd=Ve=Vf=Vrefp, Vc=Vh=Vi=Vrefm In this case, the input voltage Vx1 of the op-amp OP is given by the following equation (30):

$$Vx1 = -\frac{1}{3}Vref - \frac{2}{3}Vref + Vcm0 + \frac{2}{3}Vcm1 = 1.666[V] \quad (30)$$

The fourth embodiment corresponds to the case Case4 relating to the single-ended input configuration, in which the capacitance ratio is set such that x:y:z=1:1:4. As can be seen from FIG. 6, the conditions Con1-Con4 are all met. Therefore, a sampling/holding operation (MDAC operation) can be performed by dividing the input voltage Vin by a divisional ratio of 1/4.

According to the fourth embodiment, the capacitor Cf1 is constructed with the capacitors Cf1a, Cf1b connected in parallel to each other by the switches S1a, S1b, and the capacitor Cf2 is constructed with the capacitors Cf2a, Cf2b connected in parallel to each other by the switches S2a, S2b. That is, each of the capacitors Cf1, Cf2 has a variable capacitance. Here, it is assumed that the S/H circuit 1 is used in an analog-to-digital (A/D) conversion stage of a pipeline A/D converter. For example, in the initial stage of the A/D conversion stage, the switches S1a-S2b are switched ON so that the input voltage can be divided. On the other hand, in the subsequent stages of the A/D conversion stage, the switches S1a-S2b are switched OFF so that the input voltage can be directly inputted without being divided.

Fifth Embodiment

A fifth embodiment of the present invention is described below with reference to FIGS. 16A, 16B. In the fifth embodiment, the case Case20 relating to the differential input is described in detail.

Figure 16A:
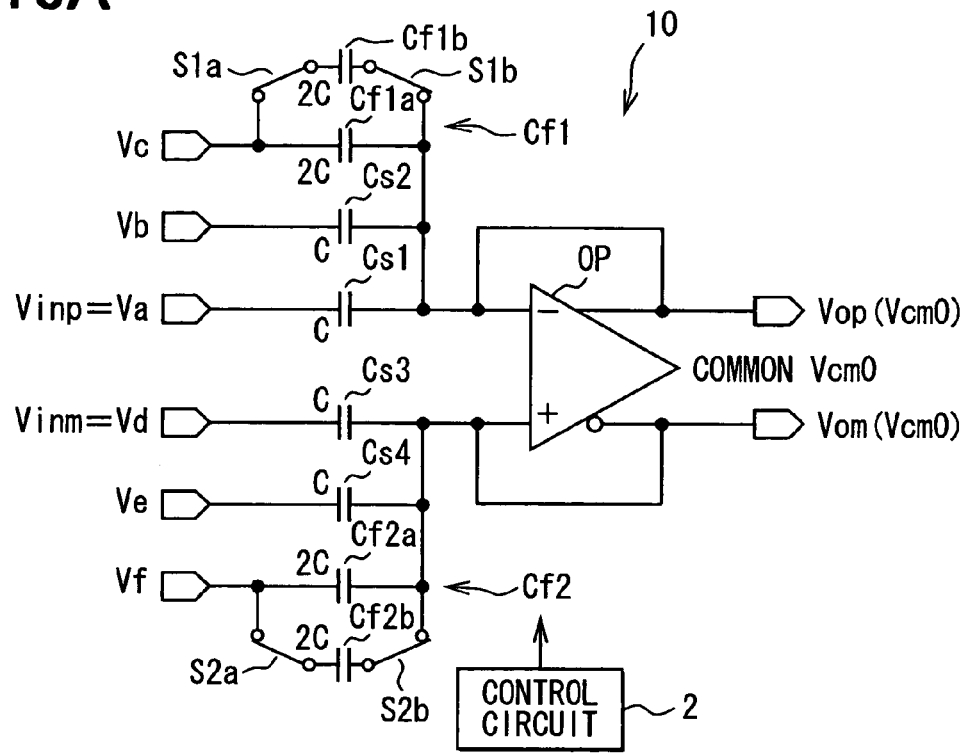
FIG. 16A is a diagram illustrating a sampling phase of a sample and hold circuit according to a fifth embodiment of the present invention.
Figure 16B:
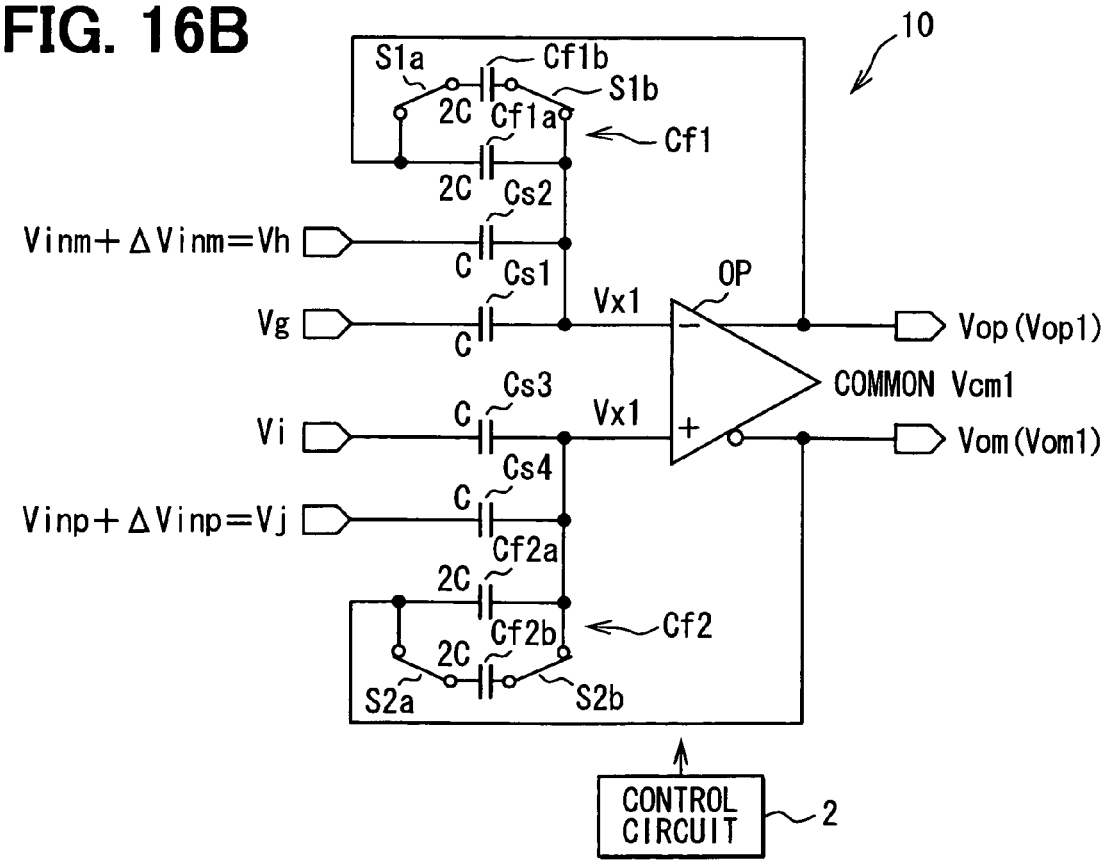
FIG. 16B is a diagram illustrating a holding phase of the sample and hold circuit according to the fifth embodiment.

FIG. 16A illustrates a connection configuration of the S/H circuit 10 in the sampling phase. FIG. 16B illustrates a connection configuration of the S/H circuit 10 in the holding phase. Each of the capacitors Cs1, Cs2, Cs3, and Cs4 has the same capacitance of C. The capacitor Cf1 is constructed with two capacitors Cf1a, Cf1b having the same capacitance of 2C. The capacitors Cf1a, Cf1b are connected in parallel to each other through switches S1a, S1b. The capacitor Cf1b can be electrically disconnected from the S/H circuit 1 by switching the switches S1a, S1b. The capacitor Cf2 is constructed with two capacitors Cf2a, Cf2b having the same capacitance of 2C. The capacitors Cf2a, Cf2b are connected in parallel to each other through switches S2a, S2b. The capacitor Cf2b can be electrically disconnected from the S/H circuit 1 by switching the switches S2a, S2b. The application of the voltage to the capacitors and the switching of the switches S1a, S1b, S2a, S2b are performed by the control circuit 2.

When Va=Vinp, Vd=Vinm, Vj=Vinp+ΔVinp, Vh=Vinm+ΔVinm, and x:y:z=1:1:N, the differential output voltage Vop1−Vom1 in the holding phase is given by the following equation (31), and the input voltage Vx of the op-amp OP is given by the following equation (32):

$$Vop1 - Vom1 = \frac{2(Vinp - Vinm) + (\Delta Vinp - \Delta Vinm) + Vi - Vg + Vb - Ve}{N} + Vc - Vf \quad (31)$$

$$Vx1 = \frac{Vg + Vi + (\Delta Vinp + \Delta Vinm) - (Vb + Ve) - N(Vc + Vf)}{2(2 + N)} + Vcm0 + \frac{N}{2+N}Vcm1 \quad (32)$$

When the switches S1a, S1b, S2a, and S2b are switched ON so that N 4, the equations (31), (32) become the following equations (33), (34), respectively:

$$Vop1 - Vom1 = \frac{2(Vinp - Vinm) + (\Delta Vinp - \Delta Vinm) + Vi - Vg + Vb - Ve}{4} + Vc - Vf \quad (33)$$

$$Vx1 = \frac{Vg + Vi + (\Delta Vinp + \Delta Vinm) - (Vb + Ve) - 4(Vc + Vf)}{12} + Vcm0 + \frac{2}{3}Vcm1 \quad (34)$$

When the S/H circuit 10 of the fifth embodiment is applied to the unit conversion circuit 7 shown in FIG. 10, the voltages Vb, Vc, Ve-Vg, Vi need to be set as follows to allow the equation (33) to match the equations (16)-(18) in a case where N=4. Here, it is defined that Vrefp=5 V (power supply voltage), Vref=2.5 V (median of the power supply voltage), Vrefm=0 V, and Vcm0=Vcm1=Vref=2.5 V.

<In a Case where the A/D Conversion Value=+1>

The voltages Vb, Vc, Ve-Vg, Vi are set as follows to allow the equation (16) to be met: Vg=Ve=Vrefp, Vb=Vc=Vf=Vi=Vrefm In this case, the input voltage Vx1 of the op-amp OP is given by the following equation (35):

$$Vx1 = Vcm0 + \frac{2}{3}Vcm1 = 4.167[V] \quad (35)$$

<In a Case where the and Conversion Value=0>

The voltages Vb, Vc, Ve-Vg, Vi are set as follows to allow the equation (17) to be met: Vb=Vc=Ve=Vf=Vg=Vi=Vrefm In this case, the input voltage Vx1 of the op-amp OP is given by the following equation (36):

$$Vx1 = Vcm0 + \frac{2}{3}Vcm1 = 4.167[V] \quad (36)$$

<In a Case where the A/D Conversion Value=−1>

The voltages Vb, Vc, Ve-Vg, Vi are set as follows to allow the equation (18) to be met: Vb=Vi=Vrefp, Vc=Ve=Vf=Vg=Vrefm In this case, the input voltage Vx1 of the op-amp OP is given by the following equation (37):

$$Vx1 = Vcm0 + \frac{2}{3}Vcm1 = 4.167[V] \quad (37)$$

The fifth embodiment corresponds to the case Case20 relating to a differential input configuration, in which the capacitance ratio is set such that x:y:z=1:1:4. As can be seen from FIGS. 12-14, the conditions Con1, and Con5-Con7 are all met. Therefore, a sampling/holding operation (MDAC operation) can be performed by dividing the differential input voltage Vinp−Vinm by a divisional ratio of 1/4.

According to the fifth embodiment, each of the capacitors Cf1, Cf2 has a variable capacitance. Therefore, the fifth embodiment can have the same advantage as the fourth embodiment.

Sixth Embodiment

A sixth embodiment of the present invention is described below. In the sixth embodiment, taking the first embodiment as an example, the variations in the conditions Con1-Con4 caused by unavoidable manufacturing variations such as capacitance variations are studied. In the first embodiment, the first through fourth conditions Con1-Con4 need to be met to allow the S/H circuit 1 to have the four characteristics (1A)-(1D).

(a) About the First Condition Con1

The equation (6) governing the input voltage Vx1 of the op-amp OP can be rewritten as the following equation (38) using α, β, γ, and η:

$$Vx1 = \frac{(\gamma + \eta) - (\alpha + \beta)}{2(x+y+z)} Vin + \ldots \quad (38)$$

The first condition Con1 governed by the equation (7) needs to be met to remove the term involving the input voltage Vin from the equation (38). If the first condition Con1 governed by the equation (7) is not met, the input voltage Vx1 of the op-amp OP in the holding phase can vary due to the input voltage Vin. When an allowable variation range of the input voltage Vx1 due to the input voltage Vin is from +Vk volts to −Vk volts, an allowable variation range of the capacitance ratio is given by the following equations (39), (40):

$$-Vk \leq \frac{(\gamma+\eta)-(\alpha+\beta)}{2(x+y+z)} Vin \leq Vk \tag{39}$$

$$-\frac{Vk}{Vin} \leq \frac{(\gamma+\eta)-(\alpha+\beta)}{2(x+y+z)} \leq \frac{Vk}{Vin} \tag{40}$$

(b) About the second and third conditions Con2, Con3

The equation (5) governing the differential output voltage Vop1−Vom1 in the holding phase can be rewritten as the following equation (41) using $\alpha$, $\beta$, $\gamma$, and $\eta$:

$$\begin{aligned} Vop1 - Vom1 &= \frac{\alpha-\beta}{z} Vin - \frac{\gamma-\eta}{z}(Vin+\Delta V) + \dots \\ &= \frac{\alpha-\beta-\gamma+\eta}{z} Vin - \frac{\gamma-\eta}{z} \Delta V + \dots \end{aligned} \tag{41}$$

In the equation (41), Vin represents the input voltage in the sampling phase, and Vin+ΔV represents the input voltage in the holding operation. The second condition Con2 governed by the equation (8) needs to be met to remove the term involving the change ΔV from the equation (41). The third condition Con3 governed by the equation (9) needs to be met to allow the term involving the input voltage Vin to be left in the equation (41). If the second condition Con2 governed by the equation (8) is not met, the differential output voltage Vop1−Vom1 in the holding phase can vary due to the change ΔV. When an allowable variation range of the differential output voltage Vop1−Vom1 is from +Vk volts to −Vk volts, an allowable variation range of the capacitance ratio is given by the following equations (42), (43):

$$-Vk \leq -\frac{\gamma-\eta}{z} \Delta V \leq Vk \tag{42}$$

$$-\frac{Vk}{\Delta V} \leq -\frac{\gamma-\eta}{z} \leq \frac{Vk}{\Delta V} \tag{43}$$

When the second condition Con2 governed by the equation (8) is substantially met, and a is slightly different from β, the differential output voltage Vop1−Vom1 is very small so that the S/H circuit 1 cannot serve as a holding circuit.

(c) About the Fourth Condition Con4

The fourth condition Con4 governed by the equation (11) needs to be met to allow the coefficient of the term involving the input voltage Vin of the equation (41) to be 2/N. When a target value of a voltage divisional ratio is set to 2/N, and an allowable variation range of the voltage divisional ratio is from +k % to −k %, an allowable variation range of the capacitance ratio is given by the following equation (44):

$$\frac{2}{N}\left(1-\frac{k}{100}\right) \leq \frac{\alpha-\beta-\gamma+\eta}{z} \leq \frac{2}{N}\left(1+\frac{k}{100}\right) \tag{44}$$

When taking into consideration the above allowable variations, the first, second, and fourth conditions Con1, Con2, and Con4 can be considered as the equations (40), (43), (44), respectively. That is, "=" (equal) in the equations (7), (8), (11) can be considered as "≈" (substantially equal). To meet the third condition Con3, the term involving the input voltage Vin needs to be substantially left in the equation (9) governing the differential output voltage Vop1−Vom1 in the holding phase. That is, "≠" (not equal) in the equation (9) means that a is substantially different from β so that a held voltage can have a magnitude suitable for practical use.

Figure 17A:
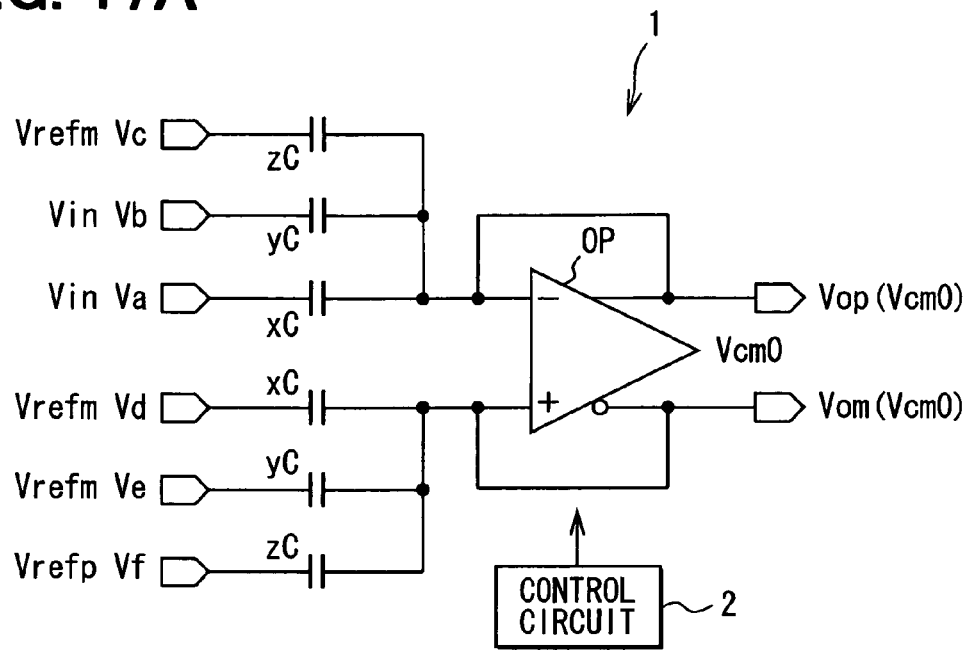
FIG. 17A is a diagram illustrating a sampling phase of a sample and hold circuit according to a sixth embodiment of the present invention.
Figure 17B:
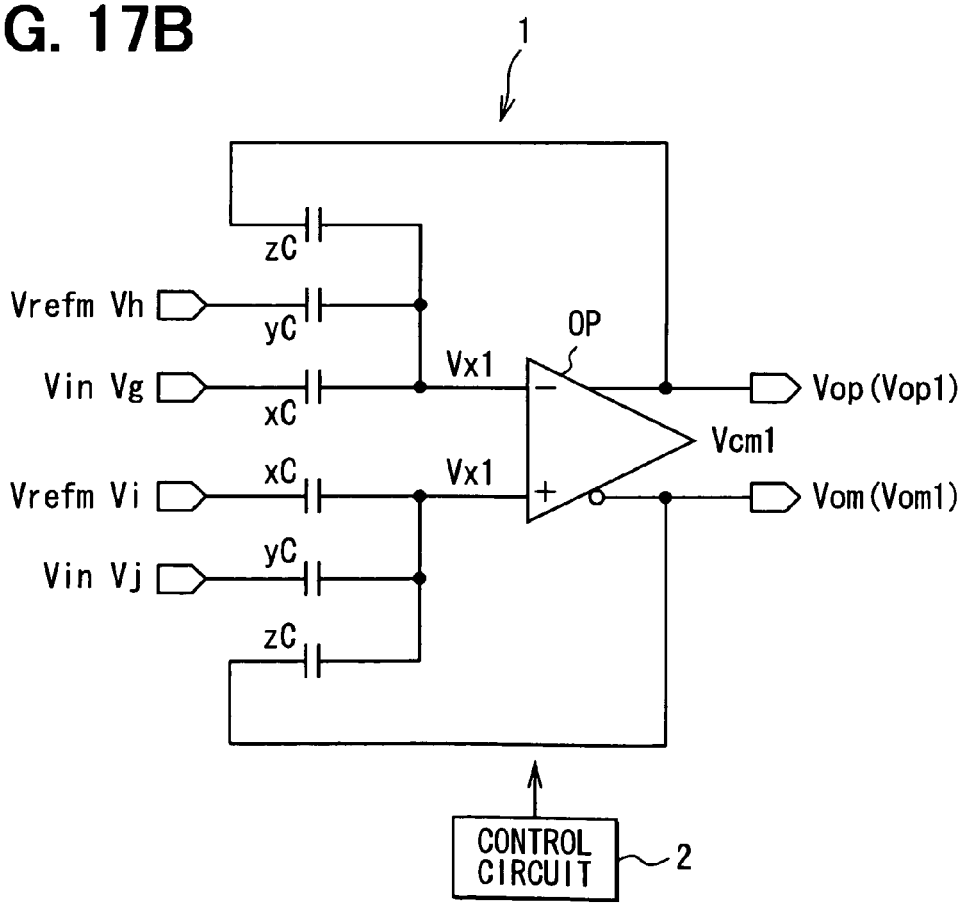
FIG. 17B is a diagram illustrating a holding phase of the sample and hold circuit according to the sixth embodiment.

Then, taking the case Case4, described in the first and fourth embodiments as an example, an error caused by the condition variations is described below with reference to FIGS. 17A and 17B. FIG. 17A illustrates the sampling phase of the S/H circuit 1, and FIG. 17B illustrates the holding phase of the S/H circuit 1.

The following equation (45) corresponding to the equation (3) in which N=4 is given by substituting Va=Vb=Vg=Vj=Vin, Vf=Vrefp, Vc=Vd=Ve=Vh=Vi=Vrefm, x=1, y=1, and z=4 into the equation (5). When x has an error of +1% due to manufacturing variations, x=1.01, y=1, and z=4. In this case, as can be seen from the following equation (46), the divisional ratio has an error of +0.5% with respect to an ideal divisional ratio of 1/4.

$$Vop1 - Vom1 = 2\left(\frac{1}{4}Vin - \frac{1}{2}Vrefp\right) = 2\left(\frac{1}{4}Vin - Vref\right) \tag{45}$$

$$Vop1 - Vom1 = 2\left(\frac{1.005}{4}Vin - Vrefp\right) \tag{46}$$

Seventh Embodiment

Figure 18:
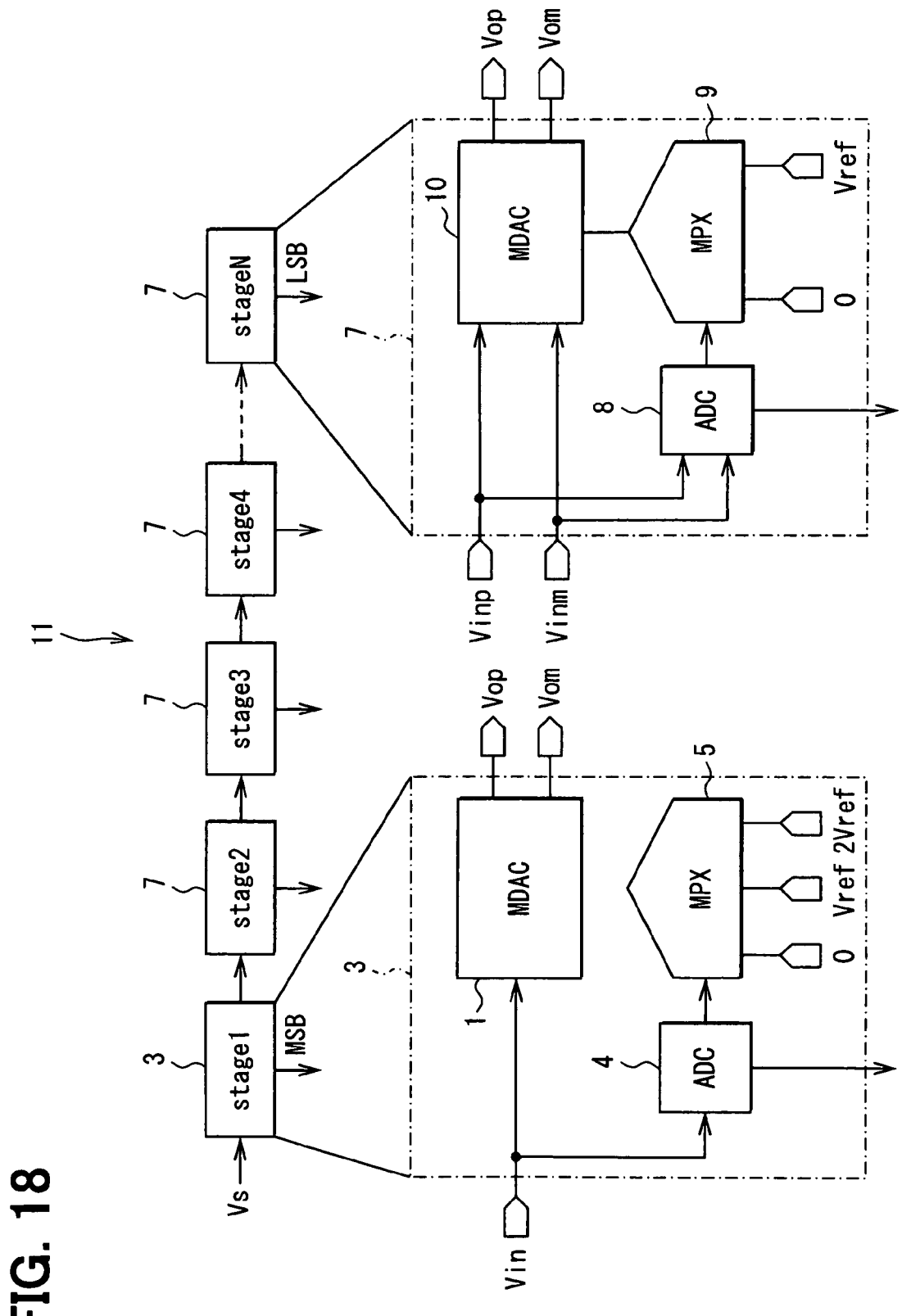
FIG. 18 is a diagram illustrating a pipeline A/D converter according to a seventh embodiment of the present invention.

A pipeline A/D converter 11 according to a seventh embodiment of the present invention is described below with reference to FIG. 18. The A/D converter 11 is constructed with N unit conversion circuits connected in series, where N is a positive number of two or more (i.e., N≧2). Specifically, the first stage of the A/D converter 11 is formed by the unit conversion circuit 3 shown in FIG. 2, and each of the second stage through the Nth stage of the A/D converter 11 is formed by the unit conversion circuit 7 shown in FIG. 10. The unit conversion circuit 3 amplifies an input voltage Vin (i.e., voltage Vs to be converted) by a gain of 1/N (N>0) and then outputs a differential output voltage Vop1−Vom1 as a residue voltage. The unit conversion circuit 7 outputs a differential output voltage Vop1−Vom1 based on an input voltage Vin, which is a differential output voltage Vop1−Vom1 outputted from the previous stage.

According to the seventh embodiment, an input dynamic range of the A/D converter 11 can be increased without using a preprocessing circuit such as a voltage divider circuit or a bias control circuit. The A/D converter 11 can perform an A/D conversion of the voltage Vs, even if the voltage Vs is outside a reference voltage range (e.g., from 0 V to 5 V).

Eighth Embodiment

Figure 19:
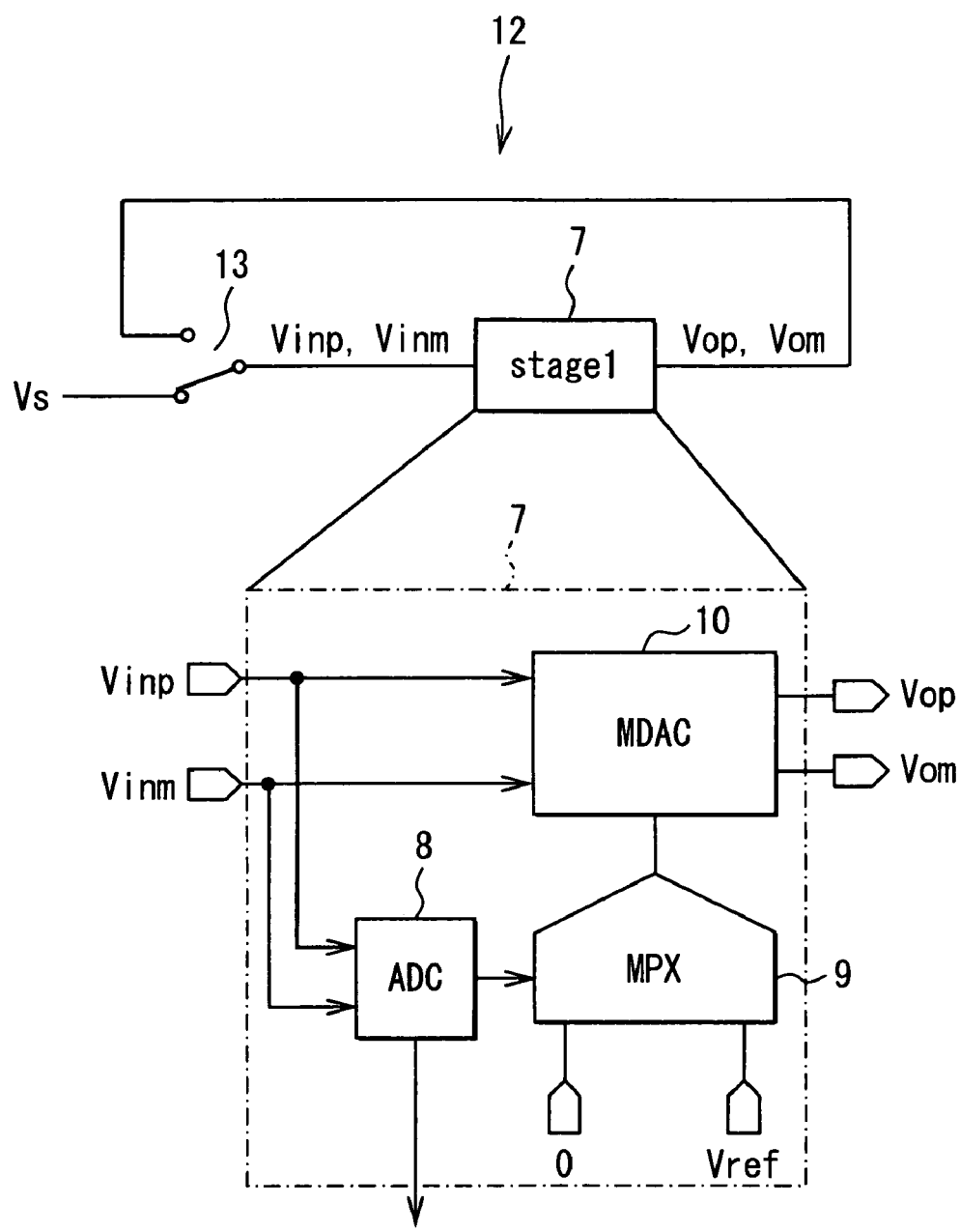
FIG. 19 is a diagram illustrating a pipeline A/D converter according to an eighth embodiment of the present invention.

A cyclic A/D converter 12 according to an eighth embodiment of the present invention is described below with reference to FIG. 19. The A/D converter 12 includes the unit conversion circuit 7 shown in FIG. 10 and a switch 13. The switch 13 selects a voltage Vs to be converted or a differential output voltage Vop−Vom outputted from the unit conversion circuit 7.

In the first cycle, the switch 13 is switched to the voltage Vs side to supply the voltage Vs from an external circuit (not shown) to the unit conversion circuit 7 so that the unit conversion circuit 7 can output a first residue voltage. In this first cycle, the unit conversion circuit 7 amplifies a differential input voltage Vinp−Vinm (i.e., voltage Vs) by a gain of 1/N (N>0) and outputs a differential output voltage Vop1−Vom1 as the first residue voltage.

Then, in the second cycle, the switch 13 is switched to the output voltage side to supply the first residue voltage to the unit conversion circuit 7 so that the unit conversion circuit 7 can output a second residue voltage without amplifying the first residue voltage by a gain of 1/N. The same operation as in the second cycle is performed in cycles following the second cycle. In this way, the residue voltage repeatedly circulates through the unit conversion circuit 7 to create codes. The codes are added together by shifting predetermined bits of each code from the most significant bit (MSB) to the most least bit (LSB). As a result, a digital code corresponding to the voltage Vs can be produced.

According to the eighth embodiment, an input dynamic range of the A/D converter 12 can be increased without using a preprocessing circuit such as a voltage divider circuit or a bias control circuit. The A/D converter 12 can perform an A/D conversion of the voltage Vs, even if the voltage Vs is outside a reference voltage range (e.g., from 0 V to 5 V). Further, as compared to the pipeline AD converter 11, the cyclic AD converter 12 can be simplified in circuit configuration and reduced in layout size in an integrated circuit (IC).

The embodiments described above can be modified in various ways. For example, in the fourth and seventh conditions Con4, Con7, the positive number N can be less than 1 (N<1). In such an approach, when the input voltage Vin is very small, the voltage Vin can be amplified. As long as necessary conditions of the first through seventh conditions are met, the number of capacitors to which the input voltage Vin is applied, the capacitors to which the input voltage Vin, the total number of capacitors, the number of feedback capacitors, and the capacitance of each capacitor can vary depending on the intended use. Unlike the capacitors Cf1, Cf2, each of the inverting-side and non-inverting-side feedback capacitors can have a fixed capacitance. Two of more capacitor pairs can serve as a feedback capacitor in the holding phase. The S/H circuit 1, 10 can be applied to a device other than an A/D converter.

Such changes and modifications are to be understood as being within the scope of the present invention as defined by the appended claims.

What is claimed is:

1. A sample and hold circuit for sampling and holding an input voltage, the sample and hold circuit comprising:
   an operational amplifier configured to convert the held voltage to a differential output voltage, the operational amplifier having inverting and non-inverting input terminals and inverting and non-inverting output terminals;
   a plurality of inverting-side capacitors, each inverting-side capacitor having a first end coupled to the inverting input terminal of the operational amplifier;
   a plurality of non-inverting-side capacitors, each non-inverting-side capacitor having a first end coupled to the non-inverting input terminal of the operational amplifier, the plurality of non-inverting-side capacitors being pared with the plurality of inverting-side capacitors to provide a plurality of capacitor pairs, each capacitor pair including one inverting-side capacitor and one non-inverting-side capacitor having a same capacitance; and
   a control circuit, in a sampling phase of the input voltage, configured to apply the input voltage to at least one of the plurality of inverting-side and non-inverting-side capacitors and apply a predetermined voltage to others of the plurality of inverting-side and non-inverting-side capacitors, the control circuit, in a holding phase of the input voltage, being configured to connect a second end of the inverting-side capacitor of at least one capacitor pair to the non-inverting output terminal of the operational amplifier, connect a second end of the non-inverting-side capacitor of the at least one capacitor pair to the inverting output terminal of the operational amplifier, and apply the input voltage to at least one of the inverting-side and the non-inverting-side capacitors of other capacitor pairs,
   wherein a total capacitance of the inverting-side capacitors to which the input voltage is applied in the sampling phase is defined as $\alpha$,
   wherein a total capacitance of the non-inverting-side capacitors to which the input voltage is applied in the sampling phase is defined as $\beta$,
   wherein a total capacitance of the inverting-side capacitors to which the input voltage is applied in the holding phase is defined as $\gamma$,
   wherein a total capacitance of the non-inverting-side capacitors to which the input voltage is applied in the holding phase is defined as $\eta$,
   wherein $\alpha$ is substantially different from $\beta$, and
   wherein a total capacitance of the at least one capacitor pair is substantially equal to $(\alpha-\beta-\gamma+\eta)\cdot(N/2)$, where N is a positive number.

2. The sample and hold circuit according to claim 1, wherein $\gamma$ is substantially equal to $\eta$.

3. The sample and hold circuit according to claim 2, wherein $\alpha+\beta$ is substantially equal to $\gamma+\eta$.

4. The sample and hold circuit according to claim 1, wherein the input voltage is a differential input voltage comprising an inverting input voltage and a non-inverting input voltage,
   wherein a total capacitance of the inverting-side capacitors to which the non-inverting input voltage is applied in the sampling phase is defined as $\alpha p$,
   wherein a total capacitance of the non-inverting-side capacitors to which the non-inverting input voltage is applied in the sampling phase is defined as $\beta p$,
   wherein a total capacitance of the inverting-side capacitors to which the non-inverting input voltage is applied in the holding phase is defined as $\gamma p$,
   wherein a total capacitance of the non-inverting-side capacitors to which the non-inverting input voltage is applied in the holding phase is defined as $\eta p$,
   wherein a total capacitance of the inverting-side capacitors to which the non-inverting input voltage is applied in the sampling phase is defined as $\alpha m$,
   wherein a total capacitance of the non-inverting-side capacitors to which the non-inverting input voltage is applied in the sampling phase is defined as $\beta m$,
   wherein a total capacitance of the inverting-side capacitors to which the non-inverting input voltage is applied in the holding phase is defined as $\gamma m$,
   wherein a total capacitance of the non-inverting-side capacitors to which the non-inverting input voltage is applied in the holding phase is defined as $\eta m$,
   wherein $\alpha p$ is substantially different from $\beta p$,
   wherein $\alpha m$ is substantially different from $\beta m$,
   wherein $\alpha p-\beta p$ is substantially equal to $\alpha m-\beta m$, and
   wherein the total capacitance of the at least one capacitor pair is substantially equal to $(\alpha p-\beta p-\gamma p+\eta p)\cdot(N/2)$, where N is a positive number.

5. The sample and hold circuit according to claim 4, wherein $\gamma p$ is substantially equal to $\eta p$, and wherein $\gamma m$ is substantially equal to $\eta m$.

6. The sample and hold circuit according to claim 5,
wherein $\alpha p+\beta p$ is substantially equal to $\gamma p+\eta p$, and
wherein $\alpha m+\beta m$ is substantially equal to $\gamma m+\eta m$.

7. The sample and hold circuit according to claim 1,
wherein the input voltage is a differential input voltage comprising an inverting input voltage and a non-inverting input voltage,
wherein a total capacitance of the inverting-side capacitors to which the non-inverting input voltage is applied in the sampling phase is defined as $\alpha p$,
wherein a total capacitance of the non-inverting-side capacitors to which the non-inverting input voltage is applied in the sampling phase is defined as $\beta p$,
wherein a total capacitance of the inverting-side capacitors to which the non-inverting input voltage is applied in the holding phase is defined as $\gamma p$,
wherein a total capacitance of the non-inverting-side capacitors to which the non-inverting input voltage is applied in the holding phase is defined as $\eta p$,
wherein a total capacitance of the inverting-side capacitors to which the non-inverting input voltage is applied in the sampling phase is defined as $\alpha m$,
wherein a total capacitance of the non-inverting-side capacitors to which the non-inverting input voltage is applied in the sampling phase is defined as $\beta m$,
wherein a total capacitance of the inverting-side capacitors to which the non-inverting input voltage is applied in the holding phase is defined as $\gamma m$,
wherein a total capacitance of the non-inverting-side capacitors to which the non-inverting input voltage is applied in the holding phase is defined as $\eta m$,
wherein $\alpha p$ is substantially different from $\beta p$,
wherein $\alpha m$ is substantially different from $\beta m$,
wherein $\alpha p-\beta p$ is substantially equal to $\alpha m-\beta m$, and
wherein the total capacitance of the at least one capacitor pair is substantially equal to $(\alpha m-\beta m-\gamma m+\eta m)\cdot(N/2)$, where N is a positive number.

8. The sample and hold circuit according to claim 1,
wherein the control circuit causes the operational amplifier to serve as a voltage follower in the sampling phase to bias the inverting and non-inverting input terminals of the operational amplifier to a predetermined voltage.

9. The sample and hold circuit according to claim 1,
wherein each of the inverting-side and non-inverting-side capacitors of the at least one capacitor pair has a variable capacitance.

10. A multiplying D/A converter comprising:
an input terminal configured to receive a digital value; and
the sample and hold circuit of claim 1,
wherein in the sampling phase, the control circuit of the sample and hold circuit applies the input voltage to at least one of the plurality of inverting-side and non-inverting-side capacitors and a DAC voltage to at least one of the others of the plurality of inverting-side and non-inverting-side capacitors, and
wherein the DAC voltage depends on the digital value.

11. An A/D converter comprising:
an A/D conversion section configured to output an input digital value corresponding to a magnitude of the input voltage;
a multiplying D/A converter of claim 10; and
an unit conversion circuit configured to output a first residue voltage by doubling a difference between a D/A conversion value of the input digital value and a value obtained by multiplying the input voltage by 1/N,
wherein an operation in which the first residue voltage is inputted to the unit conversion circuit to cause the unit conversion circuit to output a second residue voltage is repeated a predetermined number of times to produce an A/D conversion code of the input voltage.

12. The A/D converter according to claim 11,
wherein the unit conversion circuit comprises a plurality of unit conversion circuits connected in series.

13. The A/D converter according to claim 11,
wherein the unit conversion circuit comprises a single unit conversion circuit, and
wherein the second residue voltage outputted from the unit conversion circuit is inputted to the unit conversion circuit as the first residue voltage.

14. The A/D converter according to claim 11,
wherein the unit conversion circuit outputs the second residue voltage by doubling a difference between the D/A conversion value of the input digital value and the first residue voltage.

15. A sample and hold circuit for sampling and holding an input voltage limited to a predetermined voltage range, the sample and hold circuit comprising:
an operational amplifier configured to convert the held voltage to a differential output voltage, the operational amplifier having inverting and non-inverting input terminals and inverting and non-inverting output terminals;
a plurality of inverting-side capacitors, each inverting-side capacitor having a first end coupled to the inverting input terminal of the operational amplifier;
a plurality of non-inverting-side capacitors, each non-inverting-side capacitor having a first end coupled to the non-inverting input terminal of the operational amplifier, the plurality of non-inverting-side capacitors being pared with the plurality of inverting-side capacitors to provide a plurality of capacitor pairs, each capacitor pair including one inverting-side capacitor and one non-inverting-side capacitor having a same capacitance; and
a control circuit, in a sampling phase of the input voltage, configured to apply the input voltage to at least one of the plurality of inverting-side and non-inverting-side capacitors and apply a predetermined voltage to others of the plurality of inverting-side and non-inverting-side capacitors, the control circuit, in a holding phase of the input voltage, being configured to connect a second end of the inverting-side capacitor of at least one capacitor pair to the non-inverting output terminal of the operational amplifier, connect a second end of the non-inverting-side capacitor of the at least one capacitor pair to the inverting output terminal of the operational amplifier, and apply the input voltage to at least one of the inverting-side and the non-inverting-side capacitors of other capacitor pairs,
wherein a total capacitance of the inverting-side capacitors to which the input voltage is applied in the sampling phase is defined as $\alpha$,
wherein a total capacitance of the non-inverting-side capacitors to which the input voltage is applied in the sampling phase is defined as $\beta$,
wherein a total capacitance of the inverting-side capacitors to which the input voltage is applied in the holding phase is defined as $\gamma$,
wherein a total capacitance of the non-inverting-side capacitors to which the input voltage is applied in the holding phase is defined as $\eta$,
wherein $\alpha+\beta$ is substantially equal to $\gamma+\eta$,
wherein $\alpha+\eta$ is substantially different from $\beta+\gamma$, and
wherein a total capacitance of the at least one capacitor pair is substantially equal to $(\alpha-\beta-\gamma+\eta)\cdot(N/2)$, where N is a positive number.

16. A sample and hold circuit for sampling and holding an input voltage limited to a predetermined voltage range, the sample and hold circuit comprising:

an operational amplifier configured to convert the held voltage to a differential output voltage, the operational amplifier having inverting and non-inverting input terminals and inverting and non-inverting output terminals;

a plurality of inverting-side capacitors, each inverting-side capacitor having a first end coupled to the inverting input terminal of the operational amplifier;

a plurality of non-inverting-side capacitors, each non-inverting-side capacitor having a first end coupled to the non-inverting input terminal of the operational amplifier, the plurality of non-inverting-side capacitors being pared with the plurality of inverting-side capacitors to provide a plurality of capacitor pairs, each capacitor pair including one inverting-side capacitor and one non-inverting-side capacitor having a same capacitance; and a control circuit, in a sampling phase of the input voltage, configured to apply the input voltage to at least one of the plurality of inverting-side and non-inverting-side capacitors and apply a predetermined voltage to others of the plurality of inverting-side and non-inverting-side capacitors, the control circuit, in a holding phase of the input voltage, being configured to connect a second end of the inverting-side capacitor of at least one capacitor pair to the non-inverting output terminal of the operational amplifier, connect a second end of the non-inverting-side capacitor of the at least one capacitor pair to the inverting output terminal of the operational amplifier, and apply the input voltage to at least one of the inverting-side and the non-inverting-side capacitors of other capacitor pairs, wherein a total capacitance of the inverting-side capacitors to which the input voltage is applied in the sampling phase is defined as $\alpha$, wherein a total capacitance of the non-inverting-side capacitors to which the input voltage is applied in the sampling phase is defined as $\beta$, wherein a total capacitance of the inverting-side capacitors to which the input voltage is applied in the holding phase is defined as $\gamma$, wherein a total capacitance of the non-inverting-side capacitors to which the input voltage is applied in the holding phase is defined as $\eta$, wherein $\alpha+\beta$ is substantially equal to $\gamma+\eta$, wherein $\alpha$ is substantially different from $\gamma$, wherein $\beta$ is substantially different from $\eta$, and wherein a total capacitance of the at least one capacitor pair is substantially equal to $(\alpha-\beta-\gamma+\eta)\cdot(N/2)$, where N is a positive number.

* * * * *